(12) United States Patent
Yamazaki et al.

(10) Patent No.: US 12,230,718 B2
(45) Date of Patent: Feb. 18, 2025

(54) DISPLAY DEVICE AND MANUFACTURING METHOD OF DISPLAY DEVICE

(71) Applicant: Semiconductor Energy Laboratory Co., Ltd., Atsugi (JP)

(72) Inventors: Shunpei Yamazaki, Setagaya (JP); Yasuharu Hosaka, Tochigi (JP); Mitsuo Mashiyama, Oyama (JP); Kenichi Okazaki, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 510 days.

(21) Appl. No.: 17/533,588

(22) Filed: Nov. 23, 2021

(65) Prior Publication Data

US 2022/0181492 A1 Jun. 9, 2022

(30) Foreign Application Priority Data

Dec. 4, 2020 (JP) ................................. 2020-201868

(51) Int. Cl.
*H01L 29/786* (2006.01)
*H01L 29/66* (2006.01)
(Continued)

(52) U.S. Cl.
CPC .... *H01L 29/7869* (2013.01); *H01L 29/66742* (2013.01); *H10K 59/1213* (2023.02); *H10K 59/1216* (2023.02); *H10K 59/1201* (2023.02)

(58) Field of Classification Search
CPC ....... H01L 29/49; H01L 29/49; H01L 29/495; H01L 29/66007; H01L 27/1214; H01L 21/02551; H01L 21/02538; H01L 25/07–072; H01L 27/1229–1251; H01L 21/027–0338; H01L 21/312–3128; H01L 21/314–3185; H01L 21/32; H01L 21/308–3088; H01L 21/31144; H01L 21/32139; H01L 21/467; H01L 21/475;
(Continued)

(56) References Cited

U.S. PATENT DOCUMENTS 9,496,408 B2   11/2016   Yamazaki et al.
9,741,865 B2   8/2017    Yamazaki et al.
(Continued)

FOREIGN PATENT DOCUMENTS

JP    2014-007399    1/2014

*Primary Examiner* — Moin M Rahman
*Assistant Examiner* — Eric Manuel Mulero Flores
(74) *Attorney, Agent, or Firm* — Eric J. Robinson; Robinson Intellectual Property Law Office, P.C.

(57) ABSTRACT

A circuit capable of high-speed operation and a pixel are integrally formed over the same substrate. A first metal oxide film, a first metal film, and an island-shaped first resist mask are formed over a first insulating layer. An island-shaped first metal layer and an island-shaped first oxide semiconductor layer are formed and a part of a top surface of the first insulating layer is exposed; then, the first resist mask is removed. A second metal oxide film, a second metal film, and an island-shaped second resist mask are formed over the first metal layer and the first insulating layer. An island-shaped second metal layer and an island-shaped second oxide semiconductor layer are formed; then, the second resist mask is removed. The first metal layer and the second metal layer are removed.

10 Claims, 20 Drawing Sheets

(51) Int. Cl.
  *H10K 59/12* (2023.01)
  *H10K 59/121* (2023.01)
(58) Field of Classification Search
  CPC .............................. H01L 21/469–47576; H01L 21/8238–823892; H01L 27/092–0928; H01L 29/04–045; H01L 29/16–1608; H01L 29/18–185; H01L 29/22–2206; H01L 29/36–365; H01L 29/4908; H01L 29/66742–6678; H01L 29/786–78696; H01L 27/12–13; H01L 2924/13069; H01L 29/7869–78693; H01L 29/78687; H01L 29/1214; G09G 3/32; G09G 3/3225; G09G 3/3208; H10K 59/12; H10K 59/1213; H10K 59/1201; H10K 71/00; H10K 50/80; H10K 10/46–491
  See application file for complete search history.

(56) References Cited

U.S. PATENT DOCUMENTS

| | | |
|---|---|---|
| 9,899,536 B2 | 2/2018 | Yamazaki et al. |
| 2010/0304538 A1* | 12/2010 | Hosoya ............... H01L 27/1214 257/E21.411 |

* cited by examiner

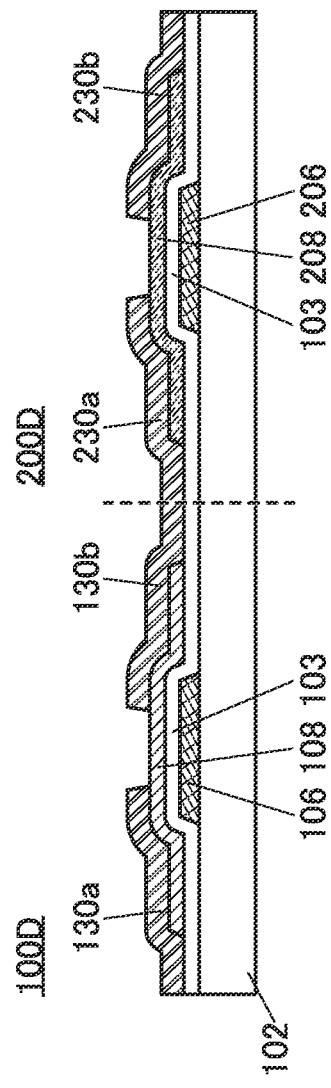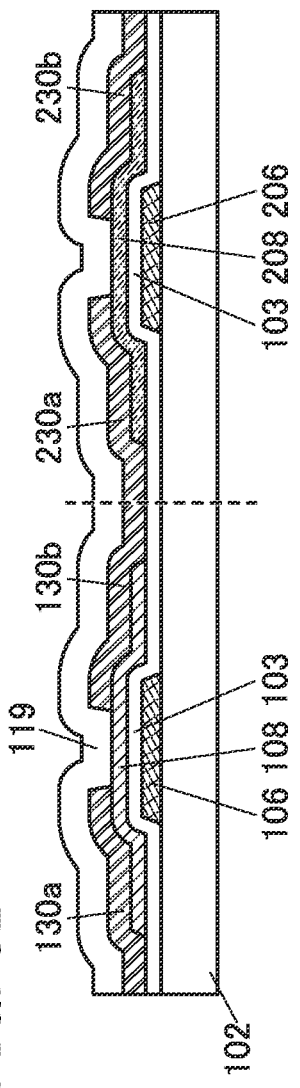

DISPLAY DEVICE AND MANUFACTURING METHOD OF DISPLAY DEVICE

BACKGROUND OF THE INVENTION

1. Field of the Invention

One embodiment of the present invention relates to a semiconductor device. One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

A driver circuit of a display device is required to have higher performance to meet demand for higher resolution and multiple gray levels of a display portion. Accordingly, an integrated circuit (IC, hereinafter also referred to as driver IC) fabricated using a single crystal substrate is employed as a driver circuit of a display device, particularly as a source driver.

The driver IC is constituted by a shift register, a latch, a level shifter, a digital-to-analog converter circuit (also referred to as DAC), an analog buffer, and the like. The shift register and the latch are circuits handling digital signals, the level shifter and the DAC are circuits converting digital signals into analog signals, and the analog buffer is a circuit generating and outputting grayscale voltages. High-speed operation is required particularly in circuits handling digital signals.

As a semiconductor material that can be used for a transistor provided in a display portion of a display device, an oxide semiconductor using a metal oxide has been attracting attention. For example, Patent Document 1 discloses a semiconductor device achieving high field-effect mobility by employing a structure in which a plurality of oxide semiconductor layers are stacked, one of the oxide semiconductor layers that serves as a channel contains indium and gallium, and the proportion of indium is higher than that of gallium.

A metal oxide can be formed by a sputtering method or the like, and thus can be used for a semiconductor layer of a transistor included in a large display device. In addition, capital investment can be reduced because production equipment for a transistor using polycrystalline silicon or amorphous silicon can be partly retrofitted and utilized. A transistor using a metal oxide has higher field-effect mobility than a transistor using amorphous silicon; thus, a high-performance display device provided with a gate driver can be achieved.

REFERENCE

Patent Document

[Patent Document 1] Japanese Published Patent Application No. 2014-007399

SUMMARY OF THE INVENTION

An object of one embodiment of the present invention is to provide a display device including a circuit capable of high-speed operation. An object of one embodiment of the present invention is to integrally form a pixel and a driver circuit over the same substrate. An object of one embodiment of the present invention is to integrally form a pixel and at least a part of a source driver over the same substrate. An object of one embodiment of the present invention is to separately form different transistors over the same substrate.

Note that the description of these objects does not preclude the existence of other objects. One embodiment of the present invention does not have to achieve all these objects. Objects other than these can be derived from the description of the specification, the drawings, the claims, and the like.

One embodiment of the present invention is a manufacturing method of a display device including a first transistor including a first oxide semiconductor layer, and a second transistor including a second oxide semiconductor layer. The method includes the steps of forming a first insulating layer over a first substrate; forming a first metal oxide film over the first insulating layer; forming a first metal film over the first metal oxide film; forming an island-shaped first resist mask over the first metal film; removing parts of the first metal film and the first metal oxide film that are not covered with the first resist mask, thereby forming an island-shaped first metal layer and an island-shaped first oxide semiconductor layer and exposing a part of a top surface of the first insulating layer; removing the first resist mask; forming a second metal oxide film over the first metal layer and the first insulating layer; forming a second metal film over the second metal oxide film; forming an island-shaped second resist mask in a region over the second metal film that does not overlap with the first metal film; removing parts of the second metal film and the second metal oxide film that are not covered with the second resist mask, thereby forming an island-shaped second metal layer and an island-shaped second oxide semiconductor layer; removing the second resist mask; and removing the first metal layer and the second metal layer.

Another embodiment of the present invention is a manufacturing method of a display device including a first transistor including a first oxide semiconductor layer, and a second transistor including a second oxide semiconductor layer. The method includes the steps of forming a first insulating layer over a first substrate; forming a first metal oxide film over the first insulating layer; forming a first metal film over the first metal oxide film; forming an island-shaped first resist mask over the first metal film; removing a part of the first metal film that is not covered with the first resist mask, thereby forming an island-shaped first metal layer; removing the first resist mask; removing a part of the first metal oxide film that is not covered with the first metal film, thereby forming an island-shaped first oxide semiconductor layer and exposing a part of a top surface of the first insulating layer; forming a second metal oxide film over the first metal layer and the first insulating layer; forming a second metal film over the second metal oxide film; forming an island-shaped second resist mask in a region over the second metal film that does not overlap with the first metal film; removing a part of the second metal film that is not covered with the second resist mask, thereby forming an island-shaped second metal layer; removing the second resist mask; removing a part of the second metal oxide film that is not covered with the second metal film, thereby forming an island-shaped second oxide semiconductor layer; and removing the first metal layer and the second metal layer.

In the above, preferably, the first metal oxide film contains indium, zinc, and gallium; the second metal oxide film contains indium; and the proportion of indium atoms to the atoms of metal elements in the second metal oxide film is higher than that in the first metal oxide film.

In the above, preferably, the second metal oxide film contains indium, zinc, and gallium; the first metal oxide film contains indium; and the proportion of indium atoms to the atoms of metal elements in the first metal oxide film is higher than that in the second metal oxide film.

In the above, preferably, the first metal film is etched by a dry etching method and the first metal oxide film is etched by a wet etching method. It is also preferable that the second metal film be etched by a dry etching method and the second metal oxide film be etched by a wet etching method. It is also preferable that the first metal layer and the second metal layer be etched by a wet etching method.

In the above, tungsten, molybdenum, or titanium is preferably used for the first metal film and the second metal film.

Another embodiment of the present invention is a display device including, over a first substrate, a display portion and a first circuit on the outer side of the display portion. The display portion includes a display element and a first transistor; the first circuit includes a second transistor; the first transistor includes a first semiconductor layer, a first gate insulating layer, and a first gate electrode. The second transistor includes a second semiconductor layer, a second gate insulating layer, and a second gate electrode; a first insulating layer is provided over the first substrate; and the first semiconductor layer and the second semiconductor layer are provided in contact with a top surface of the first insulating layer. The first gate insulating layer and the second gate insulating layer are formed by processing the same film, i.e., have the same composition. The first gate electrode and the second gate electrode are formed by processing the same film, i.e., have the same composition. The first semiconductor layer and the second semiconductor layer are formed by processing different films. The first semiconductor layer contains indium, zinc, gallium, and oxygen and the second semiconductor layer contains indium and oxygen. The proportion of indium atoms to the atoms of metal elements in the second semiconductor layer is higher than that in the first semiconductor layer.

In the above, preferably, the second semiconductor layer contains zinc and the proportion of indium atoms to the atoms of metal elements in the second semiconductor layer is higher than or equal to 50 atomic %.

In any of the above, it is preferable that the second semiconductor layer further contain tin. It is also preferable that the second semiconductor layer further contain gallium.

In any of the above, a second circuit functioning as a gate driver and a plurality of first transistors are preferably provided. In that case, the second circuit preferably includes the first transistors.

In any of the above, the first circuit preferably has a function of a source driver or a demultiplexer.

In any of the above, the display element is preferably an organic EL element.

According to one embodiment of the present invention, a display device including a circuit capable of high-speed operation can be provided. A pixel and a driver circuit can be integrally formed over the same substrate. A pixel and at least a part of a source driver can be integrally formed over the same substrate. Different transistors can be separately formed over the same substrate.

Note that the description of these effects does not preclude the existence of other effects. One embodiment of the present invention does not necessarily have all the effects. Effects other than these can be derived from the description of the specification, the drawings, the claims, and the like.

BRIEF DESCRIPTION OF THE DRAWINGS

FIGS. 8A and 8B show a structure example of a semiconductor device.

DETAILED DESCRIPTION OF THE INVENTION

Figure 1A:
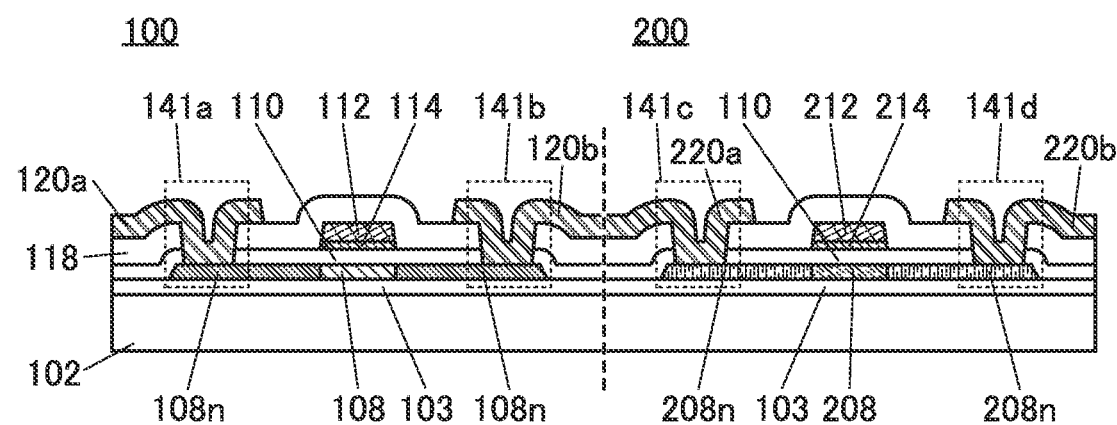
FIGS. 1A and 1B show a structure example of a semiconductor device.

Hereinafter, embodiments will be described with reference to drawings. Note that embodiments can be implemented in many different modes, and it will be readily understood by those skilled in the art that modes and details thereof can be changed in various ways without departing from the spirit and scope of the present invention. Thus, the present invention should not be interpreted as being limited to the following description of the embodiments.

In structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

In each drawing described in this specification, the size, the layer thickness, or the region of each component is sometimes exaggerated for clarity. Thus, the size, the layer thickness, or the region is not limited to the illustrated scale.

In this specification and the like, ordinal numbers such as "first" and "second" are used in order to avoid confusion among components, and the terms do not limit the components numerically.

A transistor is a kind of semiconductor element and enables amplification of current or voltage, switching operation for controlling conduction or non-conduction, and the like. A transistor in this specification includes, in its category, an insulated-gate field effect transistor (IGFET) and a thin film transistor (TFT).

The functions of a "source" and a "drain" are sometimes replaced with each other when a transistor of opposite polarity is used or when the direction of current flow is changed in circuit operation, for example. Thus, the terms "source" and "drain" can be used interchangeably in this specification.

In this specification and the like, one of a source and a drain of a transistor is referred to as a "first electrode" and the other of the source and the drain is referred to as a "second electrode" in some cases. Note that a gate is also referred to as a "gate" or a "gate electrode".

In this specification and the like, the term "electrically connected" includes the case where components are connected through an "object having any electric function". There is no particular limitation on an "object having any electric function" as long as electric signals can be transmitted and received between components that are connected through the object. Examples of the "object having any electric function" are a switching element such as a transistor, a resistor, a coil, a capacitor, and an element with a variety of functions as well as an electrode and a wiring.

In this specification and the like, the terms "film" and "layer" can be interchanged with each other. For example, in some cases, the terms "conductive layer" and "insulating layer" can be changed into "conductive film" and "insulating film", respectively.

In this specification, an EL layer means a layer containing at least a light-emitting substance (also referred to as a light-emitting layer) or a stack including the light-emitting layer, which is provided between a pair of electrodes of a light-emitting element.

In this specification and the like, a display panel that is one embodiment of the display device has a function of displaying (outputting) an image or the like on (to) a display surface. Thus, the display panel is one embodiment of an output device.

In this specification and the like, a structure in which a connector such as a flexible printed circuit (FPC) or a tape carrier package (TCP) is attached to a substrate of a display panel, or a structure in which an IC is mounted on a substrate by a chip on glass (COG) method or the like is referred to as a display panel module or a display module, or simply referred to as a display panel or the like in some cases.

Embodiment 1

Described in this embodiment are a structure example of a semiconductor device that can be applied to a display device of one embodiment of the present invention and a manufacturing method example of the semiconductor device.

The display device of one embodiment of the present invention includes a display portion, a first circuit portion, and a second circuit portion. The display portion includes a display element and a pixel circuit for driving the display element. The first circuit portion includes a circuit functioning as a gate driver (also referred to as a gate line driver circuit or a scan line driver circuit). The second circuit portion includes a circuit functioning as a source driver (also referred to as a source line driver circuit or a signal line driver circuit), or a demultiplexer circuit provided between the source driver and the display portion.

The display device also includes at least two types of transistors (a first transistor and a second transistor) over a substrate. The first transistor is used as a transistor constituting the pixel circuit in the display portion and the first circuit portion. The second transistor is used as a transistor constituting the second circuit portion.

A channel of the first transistor is formed in a first oxide semiconductor layer. A channel of the second transistor is formed in a second oxide semiconductor layer. The first oxide semiconductor layer and the second oxide semiconductor layer include metal oxide films that are different in at least one of the composition, thickness, crystallinity, and film quality. In particular, the first oxide semiconductor layer and the second oxide semiconductor layer preferably include metal oxide films with different compositions.

The second transistor preferably has higher field-effect mobility than the first transistor. This will achieve a source driver or a demultiplexer circuit, which needs to perform switching operation at high speed. Furthermore, the pixel circuit, the first circuit, and the second circuit can be integrally formed over the same substrate, i.e., integrated on a panel.

In contrast, the pixel circuit and the gate driver need to perform switching operation at lower speed than the source driver or the demultiplexer circuit, and if they are constituted by the second transistors, it is necessary to increase the size (e.g., the channel length) of each transistor in order to obtain appropriate electrical characteristics, increasing the area occupied by the circuit. Thus, the pixel circuit and the gate driver are constituted by the first transistor with a lower field-effect mobility than the second transistor, thereby occupying a smaller area. The smaller area occupied by the pixel circuit will achieve a display device with a high resolution. In addition, the smaller area occupied by the gate driver will achieve a display device with a narrow bezel.

The first oxide semiconductor layer and the second oxide semiconductor layer can be formed in the following manner. First, a first metal oxide film to be a first oxide semiconductor layer is formed over a first insulating layer and a first metal film is formed thereover. Then, a first resist mask is formed over the first metal film by a photolithography method or the like and parts of the first metal film and the metal oxide film that are not covered with the first resist mask are etched, so that a stack of an island-shaped first metal layer and an island-shaped first oxide semiconductor layer is formed and a part of a top surface of the first insulating layer is exposed. At this time, the first metal film is preferably processed by a dry etching method, in which case a decrease in pattern due to etching can be inhibited. The first metal oxide film is preferably processed by a wet etching method, in which case damage due to etching can be alleviated. The first resist mask may be removed after the island-shaped first oxide semiconductor layer is formed or after the island-shaped first metal layer is formed and before the first metal oxide film is processed.

Then, a second metal oxide film and a second metal film are stacked over the top surface of the first insulating layer and over the first metal layer and the first oxide semiconductor layer. After a second resist mask is formed in a region over the second metal film that does not overlap with the first metal layer, the second metal film and the second metal oxide film are etched in a manner similar to the above, so that an island-shaped second metal layer and an island-shaped second metal oxide layer are formed. At this time, the second metal oxide layer is etched while the first metal layer is provided over the first metal oxide layer, whereby the first metal oxide layer can be prevented from being etched by the first metal layer. Similarly to the above, the second resist mask may be removed after the island-shaped second oxide semiconductor layer is formed or after the island-shaped second metal layer is formed and before the second metal oxide film is processed.

Lastly, the first metal layer and the second metal layer are removed; when they are etched by a wet etching method, damage due to etching on the first oxide semiconductor layer and the second oxide semiconductor layer can be reduced. Since these oxide semiconductor layers are used for channel formation regions of transistors, they are particularly preferably removed under the conditions causing as less damage as possible.

Note that the second resist mask can be formed directly over the second metal oxide film without the second metal film formed. In that case, the second metal oxide film not covered with the second resist mask is etched to form the island-shaped second oxide semiconductor layer. The first oxide semiconductor layer is covered with the first metal film at this time, and thus can be prevented from being etched. Then, the second resist mask is removed after the first metal layer is removed. Alternatively, the first metal layer is removed after the second resist mask is removed.

In the above manner, the first oxide semiconductor layer and the second oxide semiconductor layer can be arranged side by side in contact with the top surface of the first insulating layer. Repeating the above steps allows three or more types of oxide semiconductor layers to be separately formed on and in contact with the same surface. Thus, one embodiment of the present invention includes in its category a semiconductor device, a display device, or an electronic device, in which three or more types of transistors using different oxide semiconductors are formed over the same surface, and a manufacturing method thereof.

In the case where three or more types of oxide semiconductor layers are formed on and in contact with the same surface, the metal oxide film of the lastly formed oxide semiconductor layer may be processed without forming the metal film described above.

More specific examples will be described below with reference to drawings.

Structure Example 1

Figure 1B:
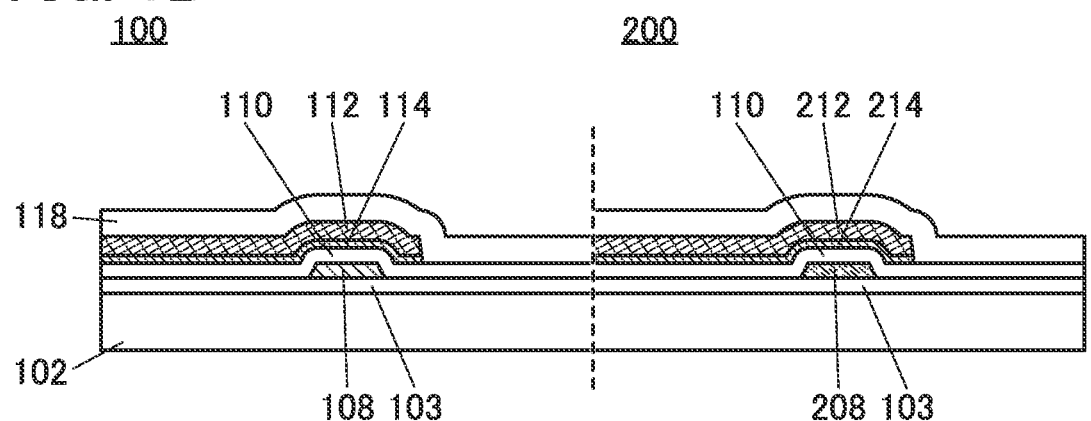

FIG. 1A shows a schematic cross-sectional view of a transistor 100 and a transistor 200 in the channel length direction, which are provided over a substrate 102. FIG. 1B shows a schematic cross-sectional view of the transistor 100 and the transistor 200 in the channel width direction.

The transistor 100 is provided over the substrate 102 and includes an insulating layer 103, a semiconductor layer 108, an insulating layer 110, a metal oxide layer 114, a conductive layer 112, an insulating layer 118, and the like. The island-shaped semiconductor layer 108 is provided on and in contact with the insulating layer 103. The insulating layer 110 is provided in contact with a top surface of the insulating layer 103 and top and side surfaces of the semiconductor layer 108. The metal oxide layer 114 and the conductive layer 112 are stacked in this order over the insulating layer 110 and include portions overlapping with the semiconductor layer 108. The insulating layer 118 is provided to cover a top surface of the insulating layer 110, a side surface of the metal oxide layer 114, and a top surface of the conductive layer 112.

The transistor 200 is provided over the substrate 102 and includes the insulating layer 103, a semiconductor layer 208, the insulating layer 110, a metal oxide layer 214, a conductive layer 212, the insulating layer 118, and the like. The island-shaped semiconductor layer 208 is provided on and in contact with the insulating layer 103. The insulating layer 110 is provided in contact with the top surface of the insulating layer 103 and top and side surfaces of the semiconductor layer 208. The metal oxide layer 214 and the conductive layer 212 are stacked in this order over the insulating layer 110 and include portions overlapping with the semiconductor layer 208. The insulating layer 118 is provided to cover the top surface of the insulating layer 110, a side surface of the metal oxide layer 214, and a top surface of the conductive layer 212.

As shown in FIG. 1A, the transistor 100 may include a conductive layer 120a and a conductive layer 120b over the insulating layer 118. The conductive layers 120a and 120b function as a source electrode and a drain electrode. The conductive layers 120a and 120b are electrically connected to low-resistance regions 108n in the semiconductor layer 108 through an opening 141a or an opening 141b provided in the insulating layers 118 and 110.

The transistor 200 may include a conductive layer 220a and a conductive layer 220b over the insulating layer 118. The conductive layers 220a and 220b function as a source electrode and a drain electrode. The conductive layers 220a and 220b are electrically connected to low-resistance regions 208n in the semiconductor layer 208 through an opening 141c or an opening 141d provided in the insulating layers 118 and 110.

The semiconductor layer 108 of the transistor 100 and the semiconductor layer 208 of the transistor 200 include metal oxide films having compositions different from each other. The semiconductor layer 108 and the semiconductor layer 208 include films that are formed by processing different metal oxide films.

The semiconductor layer 108 and the semiconductor layer 208 can include metal oxide films that are different in at least one of the thickness, crystallinity, carrier concentration, and film quality as well as the composition. In that case, the composition, thickness, deposition conditions, and the like are preferably made different so that the field-effect mobility of the transistor 200 is higher than that of the transistor 100.

Here, the compositions of the semiconductor layers 108 and 208 are described. In the case where the semiconductor layers 108 and 208 include metal oxide films with different compositions, the semiconductor layer 108 preferably includes a metal oxide containing at least indium, gallium, zinc, and oxygen. In contrast, the semiconductor layer 208 preferably includes a metal oxide containing at least indium and oxygen. In addition, the semiconductor layer 208 may further contain zinc. The semiconductor layer 208 may contain tin. The semiconductor layer 208 may contain gallium. The semiconductor layer 108 may contain titanium.

Indium gallium zinc oxide (also denoted as In—Ga—Zn oxide or IGZO), or the like can be used for the semiconductor layer 108. For the semiconductor layer 208, indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—Zn oxide), or the like can be typically used. Indium tin oxide containing silicon, or the like can also be used.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of aluminum and yttrium.

The compositions of the semiconductor layers 108 and 208 greatly affect the electrical characteristics and reliability of the transistor 100 or 200. For example, an increase in the indium content in the semiconductor layer 208 can increase the carrier mobility and achieve a transistor with high field-effect mobility.

In the case where an In—Zn oxide is used for the semiconductor layer 208, it is preferable to use a metal oxide film in which the proportion of In atoms is higher than or equal to that of Zn atoms. For example, it is possible to use a metal oxide film in which the atomic ratio of metal elements is In:Zn=1:1, In:Zn=2:1, In:Zn=3:1, In:Zn=4:1, In:Zn=5:1, In:Zn=7:1, or In:Zn=10:1, or in the neighborhood thereof.

In the case where an In—Sn oxide is used for the semiconductor layer 208, it is preferable to use a metal oxide film in which the proportion of In atoms is higher than or equal to that of Sn atoms. For example, it is possible to use a metal oxide film in which the atomic ratio of metal elements is In:Sn=1:1, In:Sn=2:1, In:Sn=3:1, In:Sn=4:1, In:Sn=5:1, In:Sn=7:1, or In:Sn=10:1, or in the neighborhood thereof.

In the case where an In—Sn—Zn oxide is used for the semiconductor layer 208, it is possible to use a metal oxide film in which the proportion of indium atoms to the atoms of metal elements is higher than that of Sn atoms and that of Zn atoms. It is further preferable to use a metal oxide film in which the proportion of Zn atoms is higher than that of Sn atoms. In other words, a metal oxide film in which the atomic proportions of the metal elements satisfy In>Sn, In>Zn, and Zn>Sn is preferably used as the semiconductor layer 208.

In the case where an In—Ga—Zn oxide is used for the semiconductor layer 208, it is possible to use a metal oxide film in which the proportion of In atoms to the atoms of the metal elements is higher than that of Ga atoms. It is further preferable to use a metal oxide film in which the proportion of Zn atoms is higher than that of Ga atoms. In other words, a metal oxide film in which the atomic proportions of the metal elements satisfy In>Ga and Zn>Ga is preferably used as the semiconductor layer 208.

For example, a metal oxide film which has any of the following atomic ratios of metal elements can be used as the semiconductor layer 208: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=10:1:3, In:Ga:Zn=5:1:6, In:Ga:Zn=5:1:7, In:Ga:Zn=5:1:8, In:Ga:Zn=6:1:6, In:Ga:Zn=5:2:5, or in the neighborhood thereof.

In particular, it is preferable to use as the semiconductor layer 208 a metal oxide film containing indium and zinc, in which the proportion of indium atoms to the atoms of metal elements contained in the metal oxide is higher than or equal to 50 atomic %, preferably higher than or equal to 60 atomic %, further preferably higher than or equal to 70 atomic %.

In the case where an In—Ga—Zn oxide is used for both of the semiconductor layers 108 and 208, the semiconductor layer 208 can be formed using a metal oxide film that has a higher proportion of In atoms to the atoms of the metal elements than a metal oxide film used as the semiconductor layer 108.

Also in the case where an In—Ga—Zn oxide is used for the semiconductor layer 108 and a metal oxide containing indium other than the In—Ga—Zn oxide is used for the semiconductor layer 208, the semiconductor layer 208 can be formed using a metal oxide film that has a higher proportion of In atoms to the atoms of the metal elements than a metal oxide film used as the semiconductor layer 108.

A metal oxide containing indium other than the In—Ga—Zn oxide can be used for the semiconductor layer 108. Also in that case, the semiconductor layer 208 can be formed using a metal oxide film that has a higher proportion of In atoms to the atoms of the metal elements than a metal oxide film used as the semiconductor layer 108.

The components of the transistors 100 and 200 other than the semiconductor layers can be concurrently formed in the same process. This can inhibit an increase in the number of steps even when two types of transistors are mixed.

That is, the metal oxide layers 114 and 214 are formed by processing the same metal oxide film. The conductive layers 112 and 212 are formed by processing the same conductive film. The conductive layers 120a, 120b, 220a, and 220b are formed by processing the same conductive film.

A part of the conductive layer 112 and a part of the conductive layer 212 each function as a gate electrode. A part of the insulating layer 110 functions as a gate insulating layer. The transistors 100 and 200 are each what is called a top-gate transistor in which the gate electrode is provided over the semiconductor layer.

The conductive layer 112 and the metal oxide layer 114 are processed so as to have substantially the same top surface shapes. The conductive layer 212 and the metal oxide layer 214 are processed so as to have substantially the same top surface shapes.

Note that in this specification and the like, the expression "having substantially the same top surface shapes" means that at least outlines of stacked layers partly overlap with each other. For example, the case of patterning or partly patterning an upper layer and a lower layer with the use of the same mask pattern is included in the expression. The expression "having substantially the same top surface shapes" also includes the case where the outlines do not completely overlap with each other; for instance, the edge of the upper layer may be positioned on the inner side or the outer side of the edge of the lower layer.

The metal oxide layer 114 is described below. The following description can be referred to for the metal oxide layer 214, which has a function and an effect similar to those of the metal oxide layer 114.

The metal oxide layer 114 positioned between the insulating layer 110 and the conductive layer 112 functions as a barrier film that prevents diffusion of oxygen contained in the insulating layer 110 into the conductive layer 112 side. Furthermore, the metal oxide layer 114 also functions as a barrier film that prevents diffusion of hydrogen and water contained in the conductive layer 112 into the insulating layer 110 side. The metal oxide layer 114 is preferably formed using a material that is less permeable to oxygen and hydrogen than at least the material for the insulating layer 110, for example.

Even in the case where a metal material that is likely to absorb oxygen, such as aluminum or copper, is used for the conductive layer 112, the metal oxide layer 114 can prevent diffusion of oxygen from the insulating layer 110 to the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, the carrier density of the channel formation region in the semiconductor layer 108 can be extremely low.

The metal oxide layer 114 can be formed using an insulating material or a conductive material. When the metal oxide layer 114 has an insulating property, the metal oxide layer 114 functions as a part of the gate insulating layer. In contrast, when the metal oxide layer 114 has conductivity, the metal oxide layer 114 functions as a part of the gate electrode.

The metal oxide layer 114 is preferably formed using an insulating material having a higher dielectric constant than silicon oxide. It is particularly preferable to use an aluminum oxide film, a hafnium oxide film, a hafnium aluminate film, or the like, in which case the driving voltage can be reduced.

The metal oxide layer 114 can also be formed using a conductive oxide such as indium oxide, indium tin oxide (ITO), or indium tin oxide containing silicon. A conductive oxide containing indium is particularly preferable because of its high conductivity.

An oxide material containing one or more kinds of elements contained in the semiconductor layer 108 or the semiconductor layer 208 is preferably used for the metal oxide layer 114. In particular, an oxide semiconductor material that can be used for the semiconductor layer 108 or the semiconductor layer 208 is preferably used. At this time, a metal oxide film formed using the same sputtering target as the semiconductor layer 108 or the semiconductor layer 208 is preferably used as the metal oxide layer 114, in which case the same apparatus can be used.

The metal oxide layer 114 is preferably formed using a sputtering apparatus. For example, when an oxide film is formed using a sputtering apparatus, forming the film in an atmosphere containing an oxygen gas enables oxygen to be added to the insulating layer 110 and the semiconductor layer 108 in a favorable manner.

The semiconductor layer 108 includes a region overlapping with the conductive layer 112 and a pair of low-resistance regions $108n$ with the region therebetween. The region of the semiconductor layer 108 overlapping with the conductive layer 112 functions as the channel formation region of the transistor 100. The pair of low-resistance regions $108n$ functions as a source region and a drain region of the transistor 100. Similarly, the semiconductor layer 208 includes a channel formation region overlapping with the conductive layer 212 and a pair of low-resistance regions $208n$ with the region therebetween.

The low-resistance regions $108n$ and $208n$ can also be referred to as n-type regions or regions having a lower resistance, a higher carrier concentration, a higher oxygen vacancy density, or a higher impurity concentration than the channel formation region.

The low-resistance regions $108n$ and $208n$ are regions containing an impurity element. Examples of the impurity element include hydrogen, boron, carbon, nitrogen, fluorine, phosphorus, sulfur, arsenic, aluminum, and a rare gas. Typical examples of the rare gas include helium, neon, argon, krypton, and xenon. In particular, boron or phosphorus is preferably contained. Two or more of these elements may be contained.

As described later, an impurity can be added to the low-resistance regions $108n$ and $208n$ through the insulating layer 110 with the conductive layer 112 or 212 used as a mask.

It is preferable that the low-resistance regions $108n$ and $208n$ each include a region having an impurity concentration of higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of an impurity contained in the low-resistance regions $108n$ and $208n$ can be measured by an analysis method such as secondary ion mass spectrometry (SIMS) or X-ray photoelectron spectroscopy (XPS). In the case of using XPS analysis, ion sputtering from the top surface side or the back surface side is combined with XPS analysis, whereby the concentration distribution in the depth direction can be found.

The insulating layer 118 functions as a protective layer for protecting the transistor 100. An inorganic insulating material such as an oxide or a nitride can be used for the insulating layer 110, for example. Specific examples of the inorganic insulating material include silicon oxide, silicon oxynitride, silicon nitride, silicon nitride oxide, aluminum oxide, aluminum oxynitride, aluminum nitride, hafnium oxide, and hafnium aluminate.

Structure Example 2

Figure 2A:
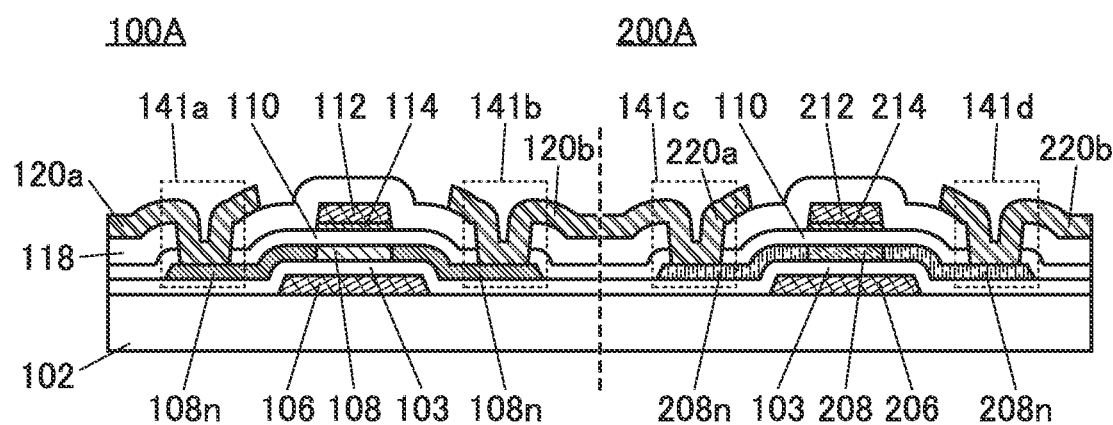
FIGS. 2A and 2B show a structure example of a semiconductor device.
Figure 2B:
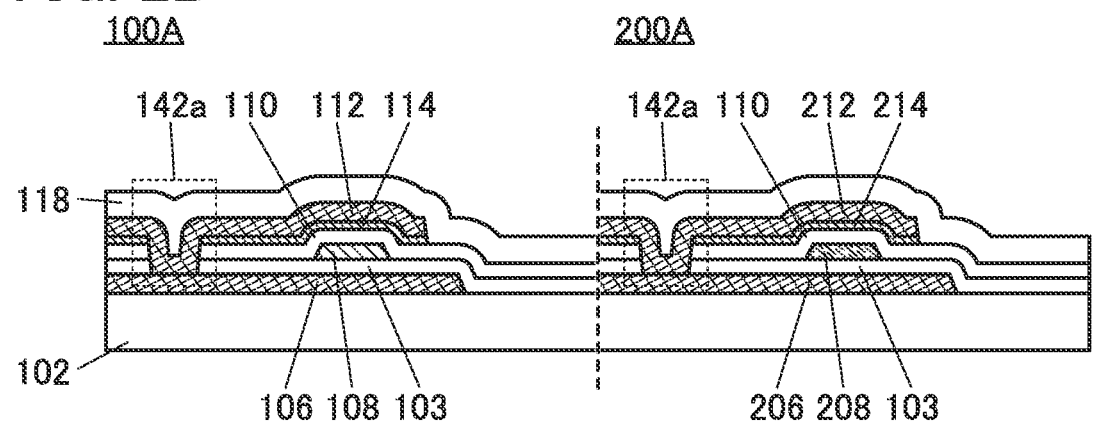

FIG. 2A is a cross-sectional view of a transistor 100A and a transistor 200A in the channel length direction, and FIG. 2B is a cross-sectional view of the transistors in the channel width direction.

The transistor 100A is different from the transistor 100 mainly in that a conductive layer 106 is provided between the substrate 102 and the insulating layer 103. The transistor 200A is different from the transistor 200 mainly in including a conductive layer 206. The conductive layer 106 includes a region overlapping with the semiconductor layer 108 and the conductive layer 112, and the conductive layer 206 includes a region overlapping with the semiconductor layer 208 and the conductive layer 212.

The conductive layers 112 and 212 each function as a second gate electrode (also referred to as a top gate electrode), and the conductive layers 106 and 206 each function as a first gate electrode (also referred to as a bottom gate electrode). A part of the insulating layer 110 functions as a second gate insulating layer of each transistor, and a part of the insulating layer 103 functions as a first gate insulating layer of each transistor.

A part of the semiconductor layer 108 that overlaps with at least one of the conductive layers 112 and 106 functions as a channel formation region. For simplicity, the part of the semiconductor layer 108 that overlaps with the conductive layer 112 is hereinafter referred to as a channel formation region in some cases; in fact, a channel may also be formed in a part of the semiconductor layer 108 that does not overlap with the conductive layer 112 but overlaps with the conductive layer 106 (part including the low-resistance region $108n$). The same applies to the semiconductor layer 208 of the transistor 200.

As shown in FIG. 2B, the conductive layer 106 may be electrically connected to the conductive layer 112 through an opening 142a formed in the metal oxide layer 114, the insulating layer 110, and the insulating layer 103. In that case, the conductive layers 106 and 112 can be supplied with the same potential. Also in the transistor 200A, the conductive layer 206 and the conductive layer 212 are electrically connected to each other.

The conductive layers 106 and 206 can be formed using a material similar to that used for the conductive layer 112, 120a, or 120b. It is particularly preferable to use a material containing copper for the conductive layer 106 because wiring resistance can be reduced.

As shown in FIG. 2B, the conductive layers 112 and 106 preferably extend beyond an end portion of the semiconductor layer 108 in the channel width direction. In that case, as shown in FIG. 2B, the semiconductor layer 108 in the channel width direction is wholly covered with the conductive layer 112 and the conductive layer 106 with the insulating layer 110 between the semiconductor layer 108 and the conductive layer 112 and with the insulating layer 103 between the semiconductor layer 108 and the conductive layer 106. Similarly, the semiconductor layer 208 is covered with the conductive layer 212 and the conductive layer 206.

In such a structure, the semiconductor layer can be electrically surrounded by electric fields generated by the pair of gate electrodes. At this time, it is particularly preferable to supply the same potential to the pair of gate electrodes. This allows electric fields for inducing a channel to be effectively applied to the semiconductor layer, increasing the on-state current of the transistors 100A and 200A. Thus, the transistors 100A and 200A can be miniaturized.

Note that the pair of gate electrodes are not necessarily connected to each other. In that case, a constant potential may be supplied to one of the pair of gate electrodes, and a signal for driving the transistor 100A or 200A may be supplied to the other. At this time, the potential supplied to the one of the gate electrodes can control the threshold voltage at the time of driving the transistor 100A or 200A with the other gate electrode.

In the manufacturing process of the transistors 100A and 200A, the transistors 100 and 200 can be concurrently manufactured over the same substrate. This allows achieving of a display device in which the four types of transistors 100, 100A, 200, and 200A are mixed. It is also possible to achieve a display device in which either or both of the transistors 100 and 100A and either or both of the transistors 200 and 200A are mixed.

Structure Example 3

Figure 3A:
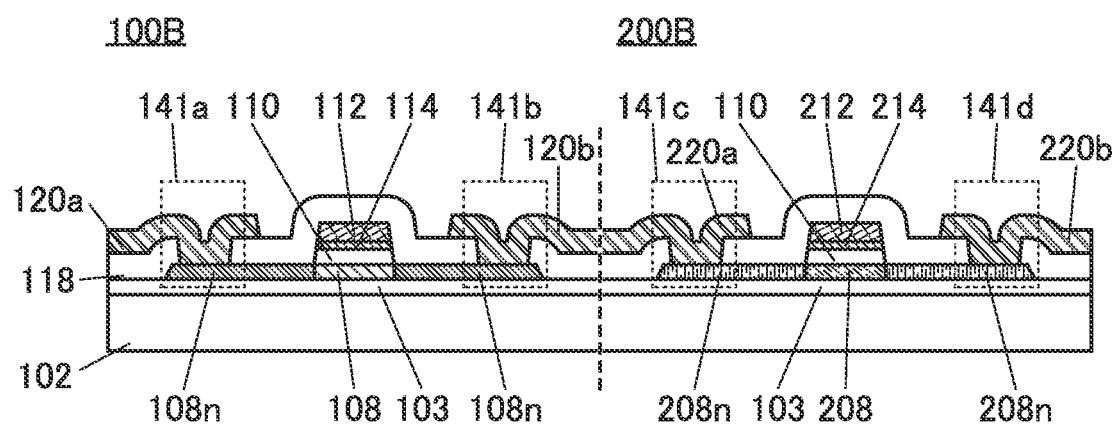
FIGS. 3A and 3B show a structure example of a semiconductor device.
Figure 3B:
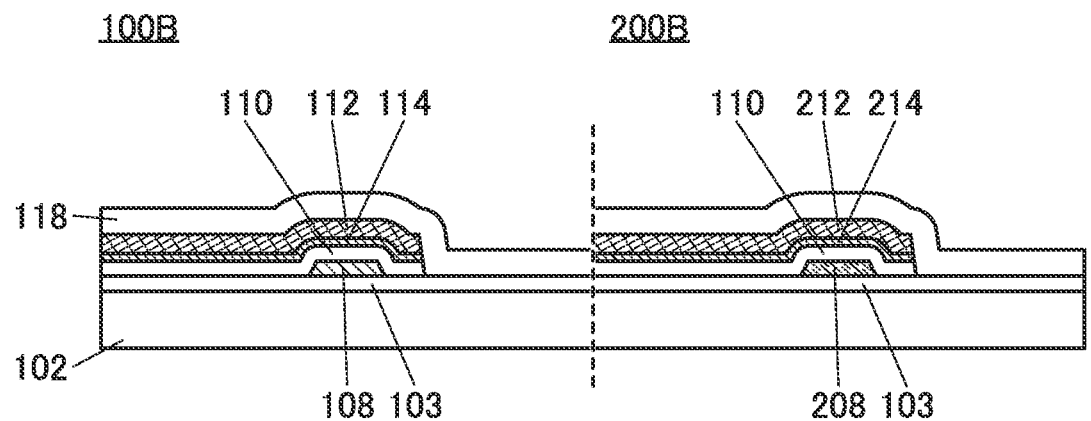

FIG. 3A is a cross-sectional view of a transistor 100B and a transistor 200B in the channel length direction, and FIG. 3B is a cross-sectional view of the transistors in the channel width direction.

The transistors 100B and 200B are different from the transistors 100 and 200 mainly in the shape of the insulating layer 110.

The insulating layer 110 is described below. Description is made on the transistor 100B here, but a similar effect is obtained in the transistor 200B.

The insulating layer 110 is processed so as to have substantially the same top surface shape as the top surface shapes of the conductive layer 112 and the metal oxide layer 114. The insulating layer 110 can be formed with the use of a resist mask for processing the conductive layer 112 and the metal oxide layer 114, for example.

The insulating layer 118 is provided in contact with a top surface and a side surface of the semiconductor layer 108 that are not covered with the conductive layer 112, the metal oxide layer 114, and the insulating layer 110. The insulating layer 118 is provided to cover a top surface of the insulating layer 103, a side surface of the insulating layer 110, a side surface of the metal oxide layer 114, and a top surface and a side surface of the conductive layer 112.

The insulating layer 118 has a function of reducing the resistance of the low-resistance regions 108n. The insulating layer 118 can be formed using an insulating film that can supply an impurity to the low-resistance regions 108n by heating at the time of or after the formation of the insulating layer 118. Alternatively, the insulating layer 118 can be formed using an insulating film that can cause generation of oxygen vacancies in the low-resistance regions 108n by heating at the time of or after the formation of the insulating layer 118.

For example, an insulating film functioning as a source for supplying the impurity to the low-resistance regions 108n can be used as the insulating layer 118. In that case, the insulating layer 118 is preferably a film from which hydrogen is released by heating. When such an insulating layer 118 is formed in contact with the semiconductor layer 108, an impurity such as hydrogen can be supplied to the low-resistance regions 108n, so that the resistance of the low-resistance regions 108n can be reduced.

The insulating layer 118 is preferably formed using a formation gas containing an impurity element such as a hydrogen element.

As the insulating layer 118, for example, an insulating film containing nitride such as silicon nitride, silicon nitride oxide, silicon oxynitride, aluminum nitride, or aluminum nitride oxide can be favorably used. In particular, silicon nitride has a blocking property against hydrogen and oxygen; thus, both diffusion of hydrogen from the outside to a semiconductor layer and release of oxygen from the semiconductor layer to the outside can be prevented, achieving a highly reliable transistor.

The insulating layer 118 can also be formed using an oxide film such as silicon oxide, silicon oxynitride, aluminum oxide, or hafnium oxide.

Structure Example 4

Figure 4A:
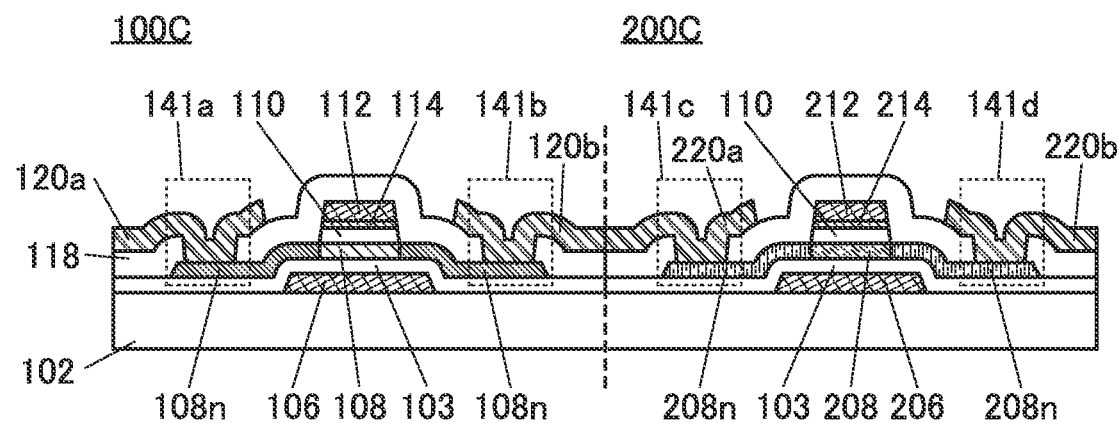
FIGS. 4A and 4B show a structure example of a semiconductor device.
Figure 4B:
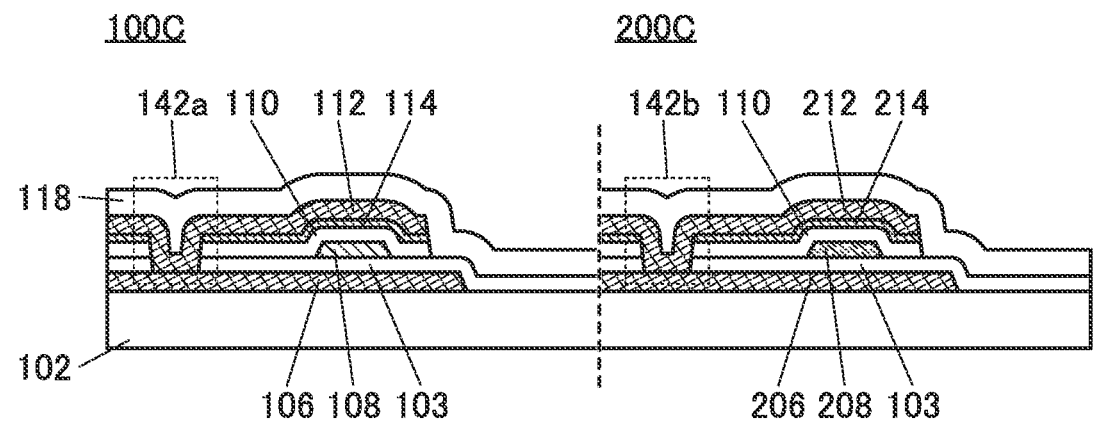

FIG. 4A is a cross-sectional view of a transistor 100C and a transistor 200C in the channel length direction, and FIG. 4B is a cross-sectional view of the transistors in the channel width direction.

The transistor 100C is an example in which the transistor 100B described in Structure example 3 is provided with the conductive layer 106 shown in Structure example 2, which functions as the first gate electrode. Similarly, the transistor 200C is an example in which the transistor 200B is provided with the conductive layer 206.

Such a structure offers a transistor with high on-state current. Alternatively, a transistor whose threshold voltage is controllable can be provided.

Manufacturing Method Example

An example of a manufacturing method of a transistor of one embodiment of the present invention will be described below. Here, description is made using the transistors 100A and 200A shown in Structure example 2 as an example.

Note that the thin films included in the semiconductor device (e.g., the insulating films, the semiconductor films, and the conductive films) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced CVD (PECVD) method and a thermal CVD method. An example of the thermal CVD method is a metal organic CVD (MOCVD) method.

Alternatively, the thin films (e.g., the insulating films, the semiconductor films, and the conductive films) included in the semiconductor device can be formed by a method such as spin coating, dipping, spray coating, inkjet printing, dispensing, screen printing, or offset printing or with a doctor knife, a slit coater, a roll coater, a curtain coater, or a knife coater.

To process thin films included in the semiconductor device, a photolithography method or the like can be used. Besides, a nanoimprinting method, a sandblasting method, a lift-off method, or the like may be used to process thin films. Alternatively, island-shaped thin films may be formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

FIGS. 5A to 5F, FIGS. 6A to 6F, and FIGS. 7A to 7E each show, side by side, schematic cross-sectional views in the channel length direction of the transistors 100A and 200A, which are shown in Structure example 2, at each step in the manufacturing process.

Hereinafter, the components of the transistors 100A and 200A that can be formed in the same step (e.g., the conductive layers 106 and 206, and the conductive layers 112 and 212) are assumed to have the same function and effect; in some cases, only one of them is described and the description is referred to for the other components.

<Formation of Conductive Layers 106 and 206>

Figure 5A:
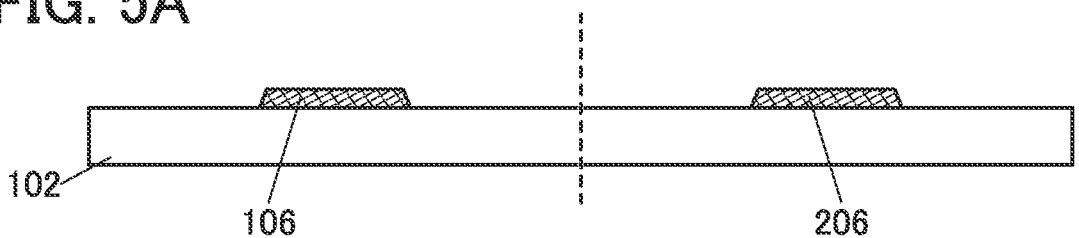
FIGS. 5A to 5F show a manufacturing method example of a semiconductor device.

A conductive film is formed over the substrate 102 and processed by etching, whereby the conductive layers 106 and 206 functioning as gate electrodes are formed (FIG. 5A).

At this time, as shown in FIG. 5A, the conductive layers 106 and 206 are preferably processed so as to have an end portion with a tapered shape. This can improve step coverage with the insulating layer 103 to be formed in the next step.

When a conductive film containing copper is used as the conductive film to be the conductive layers 106 and 206, wiring resistance can be reduced. For example, a conductive film containing copper is preferably used in the case of a large display device or a display device with a high resolution. Even in the case where a conductive film containing copper is used as the conductive layer 106 and the like, diffusion of copper to the semiconductor layer 108 side and the like can be inhibited by the insulating layer 103, whereby a highly reliable transistor can be obtained.

<Formation of Insulating Layer 103>

Figure 5B:
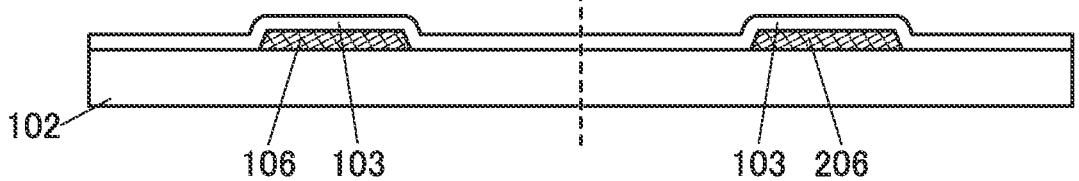

Then, the insulating layer 103 is formed to cover the substrate 102 and the conductive layers 106 and 206 (FIG. 5B). The insulating layer 103 can be formed by a PECVD method, an ALD method, a sputtering method, or the like.

In particular, the insulating layer 103 is preferably formed by a PECVD method.

The insulating layer 103 preferably has a stacked-layer structure of two or more insulating films. In that case, an insulating film closer to the conductive layer 106 side is preferably formed using an insulating film containing nitrogen. Specifically, an insulating film containing nitrogen such as a silicon nitride film, a silicon nitride oxide film, an aluminum nitride film, or a hafnium nitride film can be used as the insulating film closer to the conductive layer 106 side.

In contrast, an insulating film in contact with the semiconductor layers 108 and 208 is preferably formed using an insulating film containing oxygen. For example, an insulating layer including at least one of the following films can be used: a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating films included in the insulating layer 103 are preferably formed successively without exposure to the air with a plasma CVD apparatus.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

<Formation of Metal Oxide Film 108f>

Figure 5C:
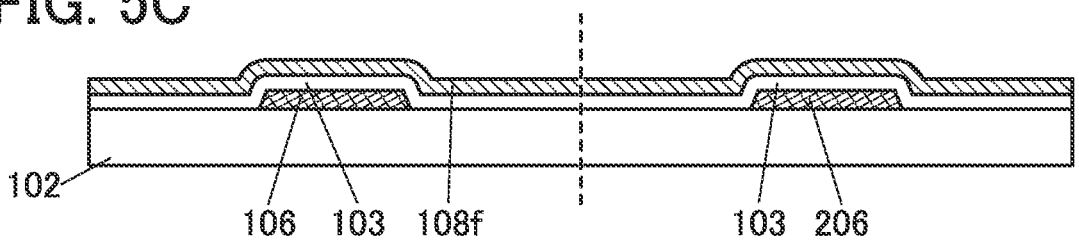

Then, a metal oxide film 108f is formed over the insulating layer 103 (FIG. 5C).

The metal oxide film 108f is preferably formed by a sputtering method using a metal oxide target.

The metal oxide film 108f is preferably a dense film with as few defects as possible. The metal oxide film 108f is preferably a highly purified film in which impurities such as hydrogen and water are reduced as much as possible. It is particularly preferable to use a metal oxide film having crystallinity as the metal oxide film 108f.

In forming the metal oxide film, an oxygen gas and an inert gas (such as a helium gas, an argon gas, or a xenon gas) may be mixed. Note that the higher the proportion of the oxygen gas in the whole formation gas (hereinafter also referred to as oxygen flow rate ratio) is in forming the metal oxide film, the higher the crystallinity of the metal oxide film can be, achieving a highly reliable transistor. In contrast, the lower the oxygen flow rate ratio is, the lower the crystallinity of the metal oxide film is, offering a transistor with increased on-state current.

In forming the metal oxide film, as the substrate temperature becomes higher, a denser metal oxide film having higher crystallinity can be formed. On the other hand, as the substrate temperature becomes lower, a metal oxide film having lower crystallinity and higher electric conductivity can be formed.

The metal oxide film is formed at a substrate temperature higher than or equal to room temperature and lower than or equal to 250° C., preferably higher than or equal to room temperature and lower than or equal to 200° C., further preferably higher than or equal to room temperature and lower than or equal to 140° C. For example, the substrate temperature is preferably set to be higher than or equal to room temperature and lower than 140° C. because the productivity is increased. When the metal oxide film is formed at a substrate temperature set to room temperature or without intentional heating, the metal oxide film can have low crystallinity.

Before the formation of the metal oxide film 108*f*, it is preferable to perform at least one of treatment for releasing water, hydrogen, an organic substance, and the like adsorbed on the surface of the insulating layer 103, and treatment for supplying oxygen to the insulating layer 103. For example, the heat treatment can be performed at a temperature of 70° C. to 200° C. in a reduced-pressure atmosphere. Alternatively, plasma treatment in an atmosphere containing oxygen may be performed. Alternatively, oxygen may be supplied to the insulating layer 103 by plasma treatment in an atmosphere containing an oxidizing gas such as dinitrogen monoxide ($N_2O$). When plasma treatment using a dinitrogen monoxide gas is performed, an organic substance on the surface of the insulating layer 103 can be favorably removed and oxygen can be supplied to the insulating layer 103. The metal oxide film 108*f* is preferably formed successively after such treatment without exposure of the surface of the insulating layer 103 to the air.

Note that in the case where the semiconductor layer 108 has a stacked-layer structure of a plurality of semiconductor layers, an upper metal oxide film is preferably formed successively after the formation of a lower metal oxide film without exposure of the surface of the lower metal oxide film to the air.

<Formation of Metal Film 131*f*>

Figure 5D:
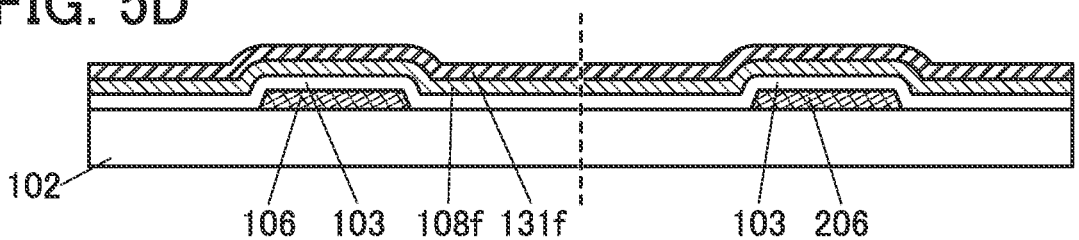

Then, a metal film 131*f* is formed over the metal oxide film 108*f* (FIG. 5D).

The metal film 131*f* can be formed by a formation method such as a sputtering method or a vacuum evaporation method. The metal film 131*f* is preferably formed successively without exposure to the air after the formation of the metal oxide film 108*f*.

The metal film 131*f* is preferably formed using a metal that is unlikely to diffuse into the oxide semiconductor included in the metal oxide film 108*f*. This can reduce the carrier concentration in the semiconductor layer 108 formed later. Furthermore, the metal film 131*f* is preferably formed using a material having a high etching rate selectivity to the metal oxide film 108*f*. In particular, the metal film 131*f* is subjected to etching by a dry etching method and etching by a wet etching method for removing a metal layer 131 later; thus, it is preferable to use a material achieving a high etching rate selectivity to the metal oxide film 108*f* in both of the etching methods. A film of a high-melting-point metal that is unlikely to diffuse into the oxide semiconductor and has a high etching rate selectivity, such as a tungsten film, a molybdenum film, or a titanium film, can be preferably used as the metal film 131*f*.

<Formation of Metal Layer 131 and Semiconductor Layer 108>

Figure 5E:
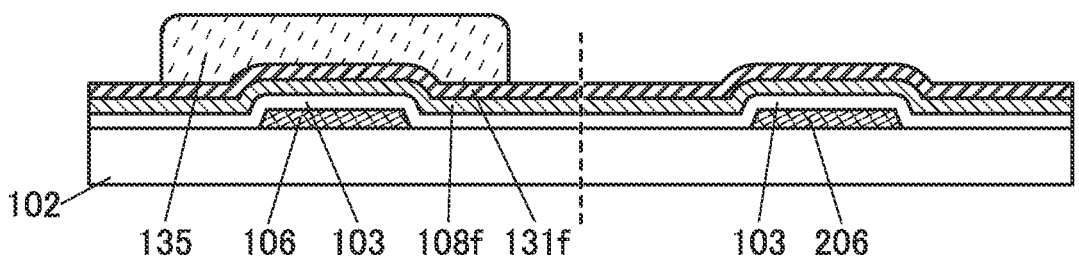

Next, a resist mask 135 is formed over the metal film 131*f* (FIG. 5E).

Then, a region of the metal film 131*f* that is not covered with the resist mask 135 is removed by etching to expose a part of a top surface of the metal oxide film 108*f*. As a result, the island-shaped metal layer 131 is formed.

The metal film 131*f* is preferably etched by a dry etching method, particularly by a highly anisotropic dry etching method. This prevents a phenomenon in which the pattern of the metal layer 131 is made smaller than that of the resist mask 135 due to etching of a side surface of the metal layer 131.

Figure 5F:
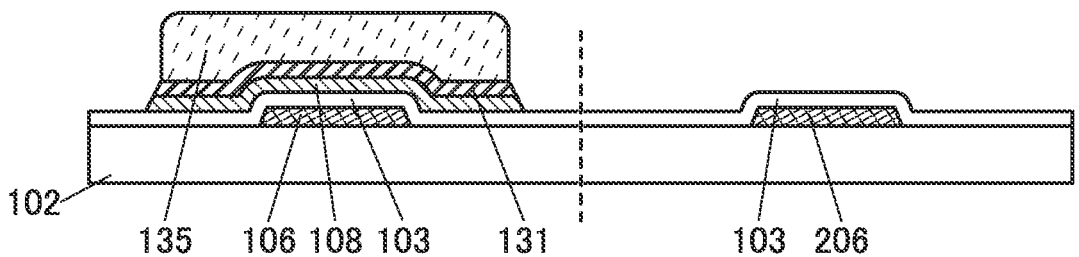

Then, a region of the metal oxide film 108*f* that is not covered with the metal layer 131 is removed by etching to expose a part of the top surface of the insulating layer 103 (FIG. 5F). The metal oxide film 108*f* can be etched by a dry etching method but is preferably etched by a wet etching method in order to reduce etching damage on the semiconductor layer 108.

As a result, the island-shaped metal layer 131 and the island-shaped semiconductor layer 108 are formed.

Figure 6A:
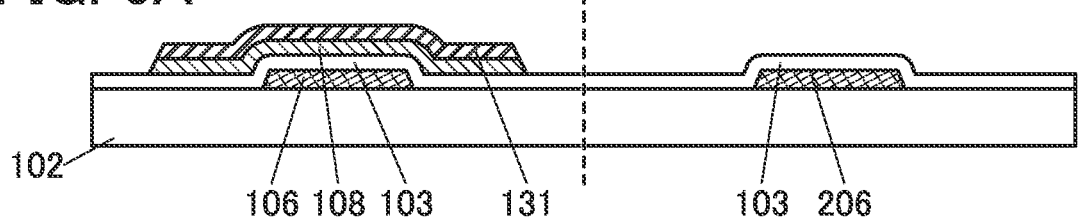
FIGS. 6A to 6F show a manufacturing method example of a semiconductor device.

After that, the resist mask 135 is removed (FIG. 6A). The resist mask 135 can be removed by a wet etching method or a dry etching method.

Note that the resist mask 135 may be removed after the formation of the metal layer 131 and before the etching of the metal oxide film 108*f*. In that case, the metal oxide film 108*f* can be etched with the metal layer 131 used as a mask for etching (also referred to as hard mask). This prevents the side surface of the semiconductor layer 108 from being subjected to the etching of the resist mask 135 and thus reduces damage on the semiconductor layer 108.

<Formation of Metal Oxide Film 208*f*>

Then, a metal oxide film 208*f* is formed over the metal layer 131, the semiconductor layer 108, and the insulating layer 103.

The metal oxide film 208*f* can be formed using a sputtering target different from that used for the above metal oxide film 108*f*. For details of the formation of the metal oxide film 208*f*, the above description of the metal oxide film 108*f* can be referred to.

<Formation of Metal Film 132*f*>

Figure 6B:
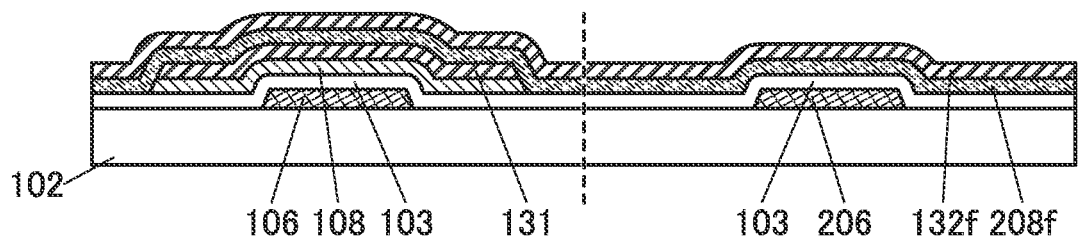

Then, a metal film 132*f* is formed over the metal oxide film 208*f* (FIG. 6B).

The metal film 132*f* is preferably formed using the same material and conditions as those of the metal film 131*f*. In addition, the metal film 132*f* is preferably formed to have the same thickness as the metal film 131*f*. In that case, the metal layer 131 and a metal layer 132 do not need to be separately removed later, sharing the step.

<Formation of Metal Layer 132 and Semiconductor Layer 208>

Figure 6C:
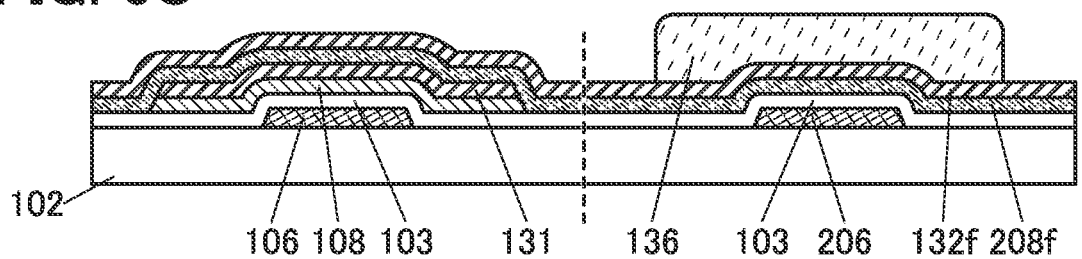

Next, a resist mask 136 is formed in a region over the metal film 132*f* that does not overlap with the metal layer 131 (FIG. 6C).

Then, a region of the metal film 132*f* that is not covered with the resist mask 136 is removed by etching to expose a part of a top surface of the metal oxide film 208*f*. As a result, the island-shaped metal layer 132 is formed.

Similarly to the metal film 131*f*, the metal film 132*f* is preferably etched by a dry etching method.

Figure 6D:
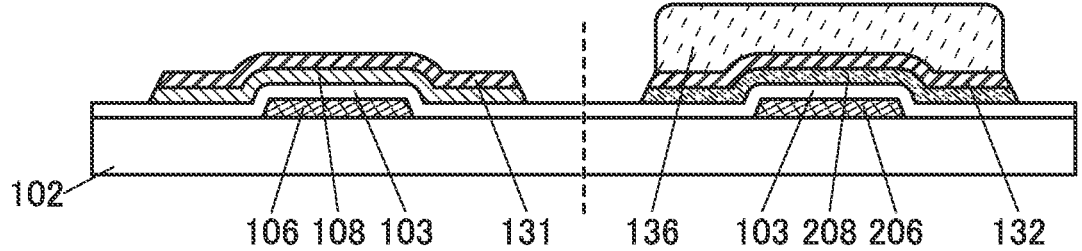

Then, a region of the metal oxide film 208*f* that is not covered with the metal layer 132 is removed by etching to expose a top surface of the metal layer 131, the side surface of the semiconductor layer 108, and the top surface of the insulating layer 103 (FIG. 6D). Similarly to the metal oxide film 108ƒ, the metal oxide film 208ƒ is preferably etched by a wet etching method.

At this time, the metal layer 131 functions as a protective layer that prevents the semiconductor layer 108 from being etched in etching the metal oxide film 208ƒ. It is thus preferable that the metal film 132ƒ and the metal oxide film 208ƒ be not etched collectively under the same condition but be etched separately by etching the metal film 132ƒ under the conditions with a high etching rate selectivity to the metal oxide film 208ƒ. As a result, the metal oxide film 208ƒ can be etched under the conditions with a high etching rate selectivity to the metal layer 131, which prevents the metal layer 131 functioning as a protective layer from being etched in etching the metal oxide film 208ƒ.

Figure 6E:
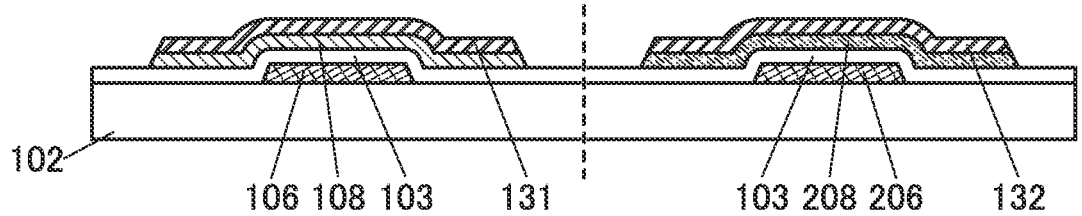

After that, the resist mask 136 is removed (FIG. 6E).

Note that similarly to the resist mask 135, the resist mask 136 may be removed after the formation of the metal layer 132 and before the etching of the metal oxide film 208ƒ. In that case, the metal oxide film 208ƒ can be etched with the metal layer 132 used as a mask for etching (also referred to as hard mask). This prevents side surfaces of the semiconductor layers 108 and 208 from being subjected to the etching of the resist mask 136 and thus reduces damage on the semiconductor layers 108 and 208.

<Removal of Metal Layer 131 and Metal Layer 132>

Figure 6F:
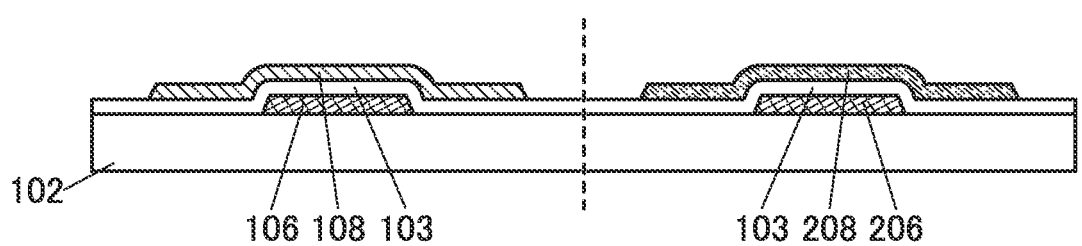

Then, the metal layers 131 and 132 are removed by etching (FIG. 6F).

When the metal layers 131 and 132 are formed under the same conditions, they can be removed at the same time in one step.

The metal layers 131 and 132 are preferably removed by a wet etching method. If the metal layers 131 and 132 are removed by a dry etching method, the semiconductor layers 108 and 208 are damaged by plasma to be modified in film quality. Using the wet etching method allows fabrication of a transistor with favorable electrical characteristics and high reliability.

Through the above steps, the semiconductor layers 108 and 208 with different compositions can be formed side by side over the same surface.

Although the semiconductor layer 208 is formed here after the formation of the semiconductor layer 108, the formation order is not limited thereto. That is, the semiconductor layer 108 may be formed after the formation of the semiconductor layer 208.

<Heat Treatment>

After the semiconductor layers 108 and 208 are formed, heat treatment is preferably performed. The heat treatment can remove hydrogen or water contained in the semiconductor layers 108 and 208 or adsorbed on the surfaces of the semiconductor layers 108 and 208. Furthermore, the film quality of the semiconductor layers 108 and 208 is improved (e.g., the number of defects is reduced or crystallinity is increased) by the heat treatment in some cases.

Furthermore, oxygen can be supplied from the insulating layer 103 to the semiconductor layers 108 and 208 by the heat treatment.

The heat treatment can be performed typically at a temperature higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, the heat treatment may be performed in the above atmosphere first, and then performed in an atmosphere containing oxygen. Alternatively, the heat treatment may be performed in a dry air atmosphere. It is preferable that the above atmosphere used for the heat treatment contain hydrogen, water, or the like as little as possible. An electric furnace, a rapid thermal annealing (RTA) apparatus, or the like can be used for the heat treatment. With the RTA apparatus, the heat treatment time can be shortened.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

<Formation of Insulating Layer 110>

Next, the insulating layer 110 is formed to cover the insulating layer 103, the semiconductor layer 108, and the semiconductor layer 208.

The insulating layer 110 is preferably formed by a PECVD method.

It is preferable to perform plasma treatment on the surfaces of the semiconductor layers 108 and 208 before the insulating layer 110 is formed. The plasma treatment can reduce impurities such as water adsorbed on the surfaces of the semiconductor layers 108 and 208. Therefore, impurities at the interface between the insulating layer 110, and the semiconductor layers 108 and 208 can be reduced, achieving a highly reliable transistor. The plasma treatment is particularly preferable in the case where the surfaces of the semiconductor layers 108 and 208 are exposed to the air in the process from the formation of the semiconductor layers 108 and 208 to the formation of the insulating layer 110. The plasma treatment can be performed in an atmosphere such as oxygen, ozone, nitrogen, dinitrogen monoxide, or argon, for example. The plasma treatment and the formation of the insulating layer 110 are preferably performed successively without exposure to the air.

After the insulating layer 110 is formed, heat treatment is preferably performed. The heat treatment can remove hydrogen or water contained in the insulating layer 110 or adsorbed on its surface. At the same time, the number of defects in the insulating layer 110 can be reduced.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

<Formation of Metal Oxide Film 114ƒ>

Then, a metal oxide film 114ƒ is formed over the insulating layer 110.

For example, the metal oxide film 114ƒ is preferably formed in an atmosphere containing oxygen. In particular, the metal oxide film 114ƒ is preferably formed by a sputtering method in an atmosphere containing oxygen. Thus, oxygen can be supplied to the insulating layer 110 at the time of forming the metal oxide film 114ƒ. Note that oxygen may be supplied to the semiconductor layer 108 or 208 at the time of forming the metal oxide film 114ƒ.

The above description of the semiconductor layer 108 can be referred to for the case where the metal oxide film 114ƒ is formed by a method similar to that of the semiconductor layer 108 or 208, i.e., by a sputtering method using an oxide target containing a metal oxide.

For example, the metal oxide film 114f may be formed by a reactive sputtering method using a metal target and oxygen as a formation gas. When aluminum is used for the metal target, for instance, an aluminum oxide film can be formed.

At the time of forming the metal oxide film 114f, a larger amount of oxygen can be supplied to the insulating layer 110 with a higher proportion of the oxygen flow rate to the total flow rate of the formation gas introduced into a deposition chamber of a deposition apparatus (i.e., with a higher oxygen flow rate ratio), or with a higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure in the deposition chamber be as close to 100% as possible.

When the metal oxide film 114f is formed by a sputtering method in an atmosphere containing oxygen in the above manner, oxygen can be supplied to the insulating layer 110 and release of oxygen from the insulating layer 110 can be prevented during the formation of the metal oxide film 114f. As a result, an extremely large amount of oxygen can be enclosed in the insulating layer 110.

After the metal oxide film 114f is formed, heat treatment is preferably performed. By the heat treatment, oxygen contained in the insulating layer 110 can be supplied to the semiconductor layers 108 and 208. When the heat treatment is performed while the metal oxide film 114f covers the insulating layer 110, oxygen can be prevented from being released from the insulating layer 110 to the outside, and a large amount of oxygen can be supplied to the semiconductor layers 108 and 208. Thus, the oxygen vacancies in the semiconductor layers 108 and 208 can be reduced, achieving a highly reliable transistor.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

After the formation of the metal oxide film 114f or the heat treatment, the metal oxide film 114f may be removed.

<Formation of Opening 142>

Next, the metal oxide film 114f, the insulating layer 110, and the insulating layer 103 are partly etched, whereby the opening 142a and an opening 142b reaching the conductive layers 106 and 206 are formed (not shown). Accordingly, the conductive layer 112 or 212 that is to be formed later can be electrically connected to the conductive layer 106 or 206 through the opening 142a or 142b.

<Formation of Conductive Layer 112, Conductive Layer 212, Metal Oxide Layer 114, and Metal Oxide Layer 214>

Figure 7A:
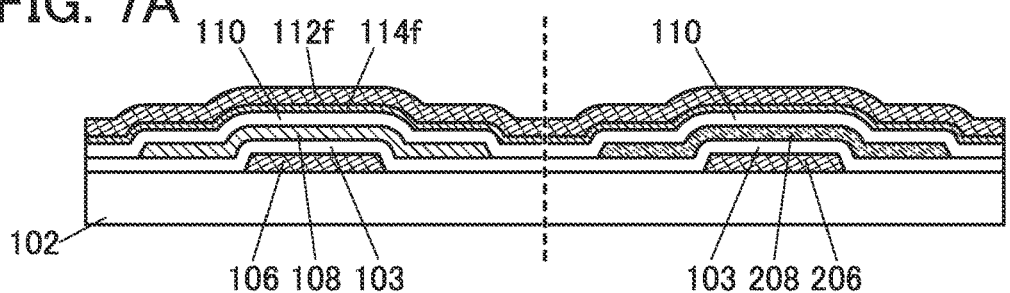
FIGS. 7A to 7E show a manufacturing method example of a semiconductor device.

Subsequently, a conductive film 112f to be the conductive layer 112 is formed over the metal oxide film 114f (FIG. 7A).

For the conductive film 112f, a low-resistance metal or a low-resistance alloy material is preferably used. It is preferable that the conductive film 112f be formed using a material from which hydrogen is less likely to be released and in which hydrogen is less likely to be diffused. Furthermore, a material that is less likely to be oxidized is preferably used for the conductive film 112f.

For example, the conductive film 112f is preferably formed by a sputtering method using a sputtering target containing a metal or an alloy.

For example, the conductive film 112f is preferably a stacked-layer film including a low-resistance conductive film and a conductive film which is less likely to be oxidized and in which hydrogen is less likely to be diffused.

Figure 7B:
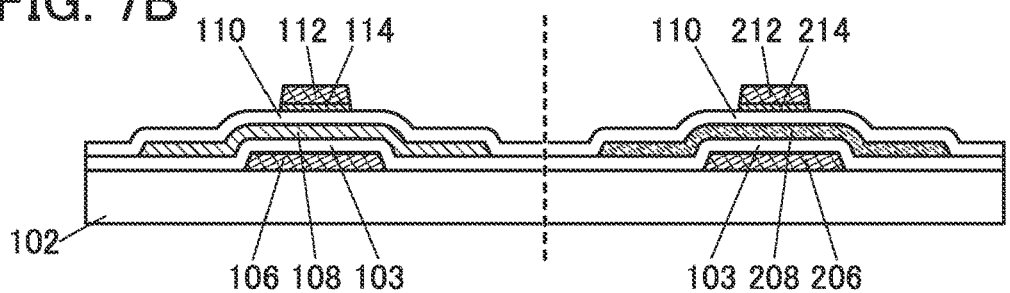

Next, the conductive film 112f and the metal oxide film 114f are partly etched, whereby the conductive layers 112 and 212 and the metal oxide layers 114 and 214 are formed (FIG. 7B). The conductive film 112f and the metal oxide film 114f are preferably processed using the same resist mask. Alternatively, the conductive layer 112 obtained by etching may be used as a hard mask for etching the metal oxide film 114f.

In particular, a wet etching method is preferably employed for etching the conductive film 112f and the metal oxide film 114f.

In such a manner, the conductive layer 112 and the metal oxide layer 114 that have substantially the same top surface shapes and the conductive layer 212 and the metal oxide layer 214 that have substantially the same top surface shapes can be formed.

As described above, when the top surface and the side surface of the semiconductor layer 108, the top surface and the side surface of the semiconductor layer 208, and the insulating layer 103 are covered with the insulating layer 110 without etching, the semiconductor layer 108, the semiconductor layer 208, the insulating layer 103, and the like can be prevented from being etched and thinned in etching the conductive film 112f or the like.

<Treatment for Supplying Impurity Element>

Figure 7C:
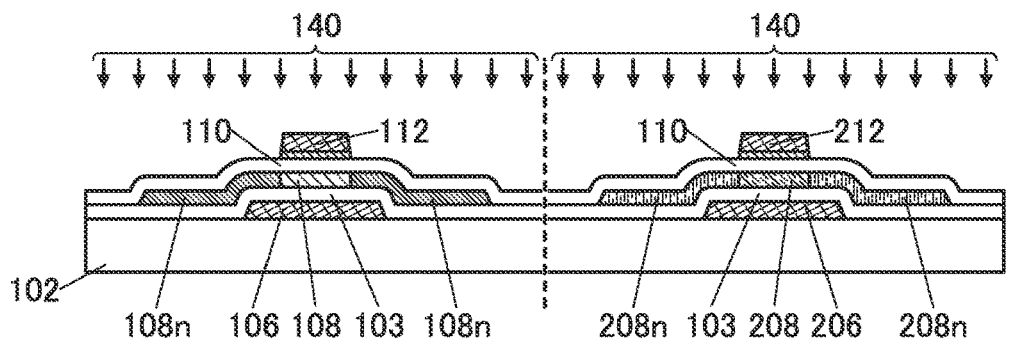

Next, treatment for supplying (adding or injecting) an impurity element 140 to the semiconductor layers 108 and 208 through the insulating layer 110 is performed with the use of the conductive layers 112 and 212 as masks (FIG. 7C). Thus, the low-resistance regions 108n can be formed in regions of the semiconductor layer 108 that are not covered with the conductive layer 112. Similarly, the low-resistance regions 208n can be formed in the semiconductor layer 208. At this time, the conditions of the treatment for supplying the impurity element 140 are preferably determined in consideration of the materials, thicknesses, and the like of the conductive layers 112 and 212 serving as masks so that as little the impurity element 140 as possible is supplied to the region of the semiconductor layer 108 that overlaps with the conductive layer 112 and the region of the semiconductor layer 208 that overlaps with the conductive layer 212. Thus, a channel formation region with sufficiently reduced impurity concentration can be formed in the region of the semiconductor layer 108 that overlaps with the conductive layer 112 and the region of the semiconductor layer 208 that overlaps with the conductive layer 212.

A plasma ion doping method or an ion implantation method can be favorably used for supplying the impurity element 140. In the above methods, the concentration profile in the depth direction can be controlled with high accuracy by the acceleration voltage and the dose of ions, for example. The use of a plasma ion doping method can increase productivity. The use of an ion implantation method with mass separation can increase the purity of an impurity element to be supplied.

The conditions of the treatment for supplying the impurity element 140 are preferably controlled so that the interface between the semiconductor layer 108 and the insulating layer 110, a portion of the semiconductor layer 108 that is close to the interface, or a portion of the insulating layer 110 that is close to the interface has the highest concentration. Thus, the impurity element 140 can be supplied at optimal concentrations to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Typical examples of the rare gas include helium, neon, argon, krypton, and xenon. It is particularly preferable to use boron, phosphorus, aluminum, magnesium, or silicon.

A gas containing the above impurity element can be used as a source gas of the impurity element 140. In the case where boron is supplied, a $B_2H_6$ gas, a $BF_3$ gas, or the like can be typically used. In the case where phosphorus is supplied, a $PH_3$ gas can be typically used. A mixed gas in which the above source gas is diluted with a rare gas may be used.

Alternatively, as the source gas, $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, or the like can be used. An ion source is not necessarily in the form of gas; a solid or a liquid heated to be vaporized may be used.

The addition of the impurity element 140 can be controlled by setting the conditions such as the acceleration voltage and the dose in consideration of the compositions, the densities, the thicknesses, and the like of the insulating layer 110 and the semiconductor layer 108.

In the case where boron or phosphorus is added by an ion implantation method or a plasma ion doping method, the dose can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

Note that the method for supplying the impurity element 140 is not limited to the above methods; plasma treatment, treatment employing thermal diffusion by heating, or the like may be performed, for example. In the case of plasma treatment, an impurity element can be added using plasma generated in a gas atmosphere containing the impurity element to be added. A dry etching apparatus, an ashing apparatus, a plasma CVD apparatus, a high-density plasma CVD apparatus, or the like can be used to generate the plasma.

In one embodiment of the present invention, the impurity element 140 can be supplied to the semiconductor layers 108 and 208 through the insulating layer 110. Thus, even in the case where the semiconductor layer 108 or 208 has crystallinity, damage to the semiconductor layers 108 and 208 at the time of supplying the impurity element 140 can be reduced, so that degradation of the crystallinity can be inhibited. This is thus preferable in the case where the electric resistance is increased due to a reduction in crystallinity.

<Formation of Insulating Layer 118>

Figure 7D:
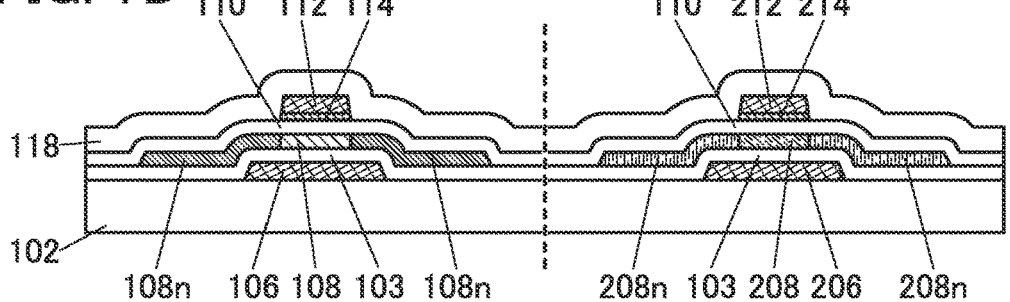

Next, the insulating layer 118 is formed to cover the insulating layer 110, the metal oxide layer 114, the conductive layer 112, the metal oxide layer 214, and the conductive layer 212 (FIG. 7D).

In the case where the insulating layer 118 is formed by a plasma CVD method at a deposition temperature too high, impurities contained in the low-resistance regions 108$n$ and the like might be diffused into a peripheral portion including the channel formation region of the semiconductor layer 108 or the electric resistance of the low-resistance regions 108$n$ might be increased. Therefore, the deposition temperature of the insulating layer 118 is determined in consideration of these.

For example, the insulating layer 118 is preferably formed at a deposition temperature higher than or equal to 150° C. and lower than or equal to 400° C., further preferably higher than or equal to 180° C. and lower than or equal to 360° C., still further preferably higher than or equal to 200° C. and lower than or equal to 250° C. By forming the insulating layer 118 at a low temperature, even a transistor with a short channel length can have favorable electrical characteristics.

Heat treatment may be performed after the formation of the insulating layer 118. By the heat treatment, the low-resistance regions 108$n$ can have low resistance more stably in some cases. For example, by heat treatment, the impurity element 140 is diffused moderately and the concentration is homogenized locally, so that the low-resistance regions 108$n$ having an ideal concentration gradient of the impurity element can be formed. Note that when the temperature of the heat treatment is too high (e.g., higher than or equal to 500° C.), the impurity element 140 is diffused also into the channel formation region, so that the electrical characteristics and reliability of the transistor might be degraded.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) in a later step can serve as the heat treatment in this step.

<Formation of Opening 141$a$ to Opening 141$d$>

Next, the insulating layer 118 and the insulating layer 110 are partly etched, so that the opening 141$a$ and the opening 141$b$ reaching the low-resistance regions 108$n$ and the opening 141$c$ and the opening 141$d$ reaching the low-resistance regions 208$n$ are formed.

<Formation of Conductive Layer 120$a$, Conductive Layer 120$b$, Conductive Layer 220$a$, and Conductive Layer 220$b$>

Figure 7E:
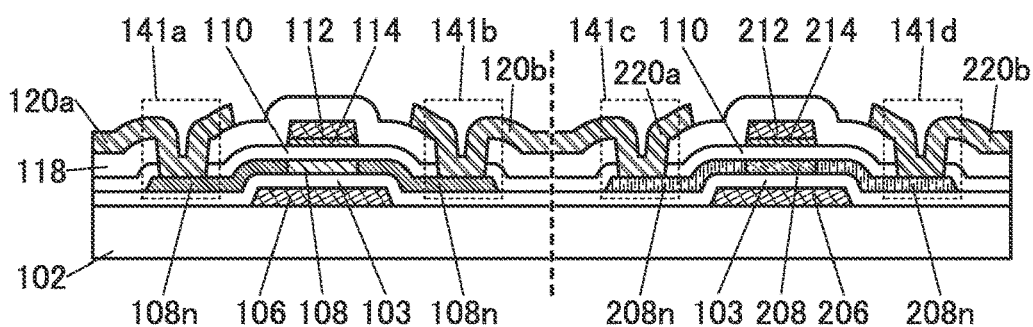

Then, a conductive film is formed over the insulating layer 118 so as to cover the openings 141$a$ to 141$d$, and the conductive film is processed into desired shapes, so that the conductive layers 120$a$, 120$b$, 220$a$, and 220$b$ are formed (FIG. 7E).

Through the above steps, the transistors 100A and 200A can be manufactured. For example, in the case where the transistor 100A is used for a pixel of a display device, a step of forming at least one of a protective insulating layer, a planarization layer, a pixel electrode, and a wiring is performed after the transistor 100A is formed.

The above is the description of the manufacturing method example.

Modification Example of Manufacturing Method

In the structure described above, the gate electrode is provided above the semiconductor layer; alternatively, the gate electrode may be provided below the semiconductor layer, i.e., what is called a bottom-gate transistor can also be fabricated.

First, as in the above manufacturing method example, the conductive layer 106, the conductive layer 206, the insulating layer 103, the semiconductor layer 108, and the semiconductor layer 208 are formed over the substrate 102 (see FIG. 6F).

Then, a conductive film is formed over the semiconductor layer 108, the semiconductor layer 208, and the insulating layer 103. After that, the conductive film is etched in a region over the semiconductor layer 108 that overlaps with the conductive layer 106 and in a region over the semiconductor layer 208 that overlaps with the conductive layer 206, so that a conductive layer 130a, a conductive layer 130b, a conductive layer 230a, and a conductive layer 230b are formed (FIG. 8A).

The conductive layer 130a, the conductive layer 130b, the conductive layer 230a, and the conductive layer 230b each function as a source electrode or a drain electrode of a transistor.

In this manner, a bottom-gate transistor 100D and a bottom-gate transistor 200D can be formed side by side over the same surface.

After that, an insulating layer 119 is preferably formed to cover the semiconductor layers 108 and 208 and the conductive layers 130a, 130b, 230a, and 230b (FIG. 8B). The insulating layer 119 can be formed in a manner similar to that of the aforementioned insulating layer 118.

The above is the description of the modification example.

At least a part of this embodiment can be implemented in appropriate combination with any of the other embodiments described in this specification.

Embodiment 2

Described in this embodiment is a structure example of a display panel that can use any of the transistors described in Embodiment 1.

Structure Example

Figure 9:
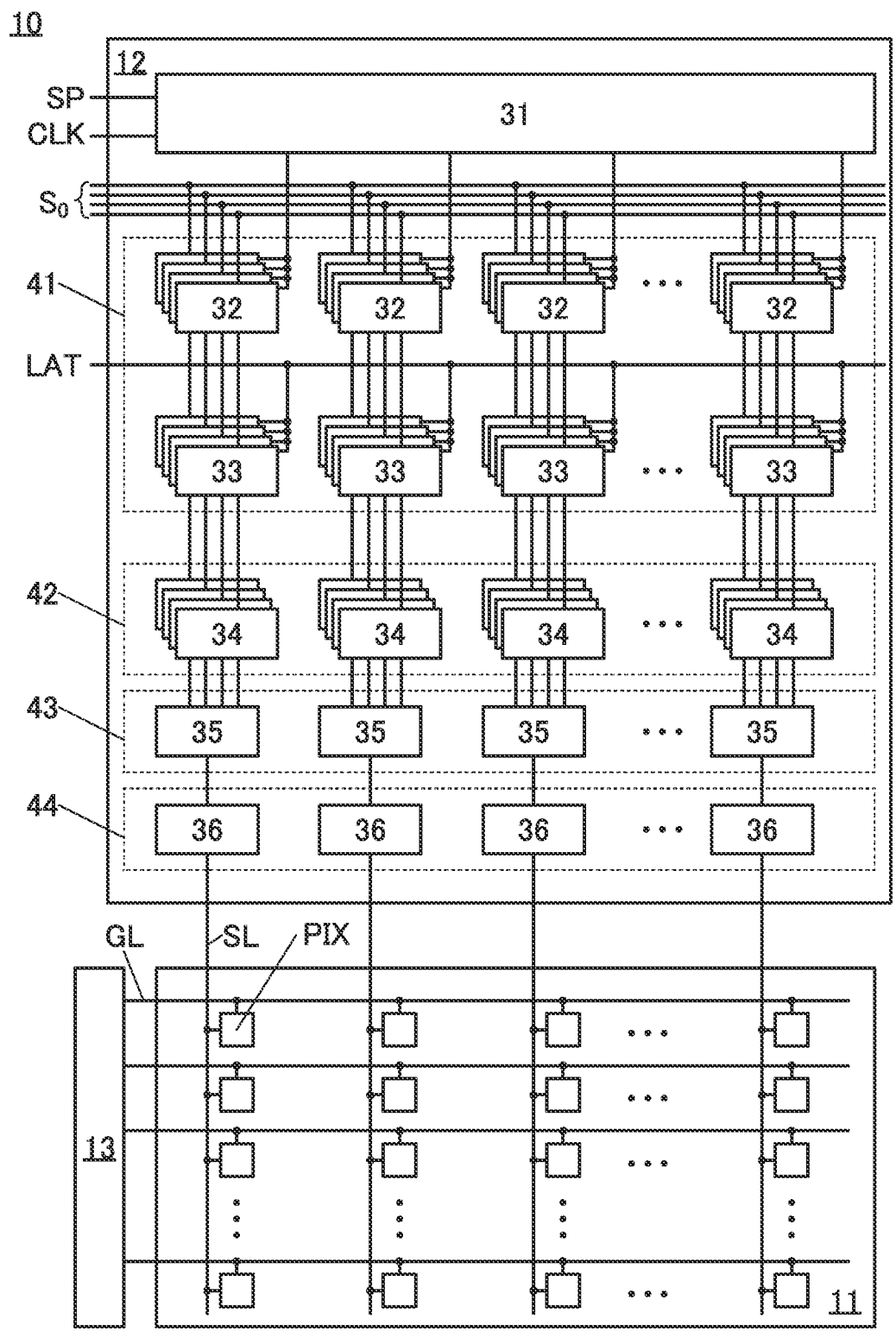
FIG. 9 shows a structure example of a display device.

FIG. 9 shows a block diagram of a display panel 10. The display panel 10 includes a display portion 11, a first driver circuit 12, and a second driver circuit 13.

In the display portion 11, a plurality of pixels PIX are arranged in a matrix. Each of the pixels include at least a display element and a transistor. An organic EL element, a liquid crystal element, or the like can be typically used as the display element.

The first driver circuit 12 includes a circuit functioning as a source driver. The first driver circuit 12 has a function of generating a gray level signal based on a video signal input from the outside and supplying the signal to a pixel included in the display portion 11.

The second driver circuit 13 includes a circuit functioning as a gate driver. The second driver circuit 13 has a function of generating a selection signal based on a signal input from the outside and supplying the signal to a pixel included in the display portion 11.

The transistor 100 and the like shown in Embodiment 1 can be applied to the pixel PIX in the display portion 11 and the second driver circuit 13. The transistor 200 and the like shown in Embodiment 1 can be applied to the first driver circuit 12. Note that as needed, the transistor 200 and the like can be used in the pixel PIX and the second driver circuit 13 and the transistor 100 can be used in the first driver circuit 12.

The display portion 11 includes a plurality of source lines SL connected to the first driver circuit 12 and a plurality of gate lines GL connected to the second driver circuit 13.

Structure Example of First Driver Circuit

A structure example of the first driver circuit 12 in the display panel 10 will be specifically described below.

The first driver circuit 12 includes a shift register circuit 31, a latch circuit portion 41, a level shifter circuit portion 42, a D/A converter portion 43, an analog buffer circuit portion 44, and the like.

The latch circuit portion 41 includes a plurality of latch circuits 32 and a plurality of latch circuits 33. The level shifter circuit portion 42 includes a plurality of level shifter circuits 34. The D/A converter portion 43 includes a plurality of DAC circuits 35. The analog buffer circuit portion 44 includes a plurality of analog buffer circuits 36.

A clock signal CLK and a start pulse signal SP are input to the shift register circuit 31. The shift register circuit 31 generates a timing signal whose pulse sequentially shifts in accordance with the clock signal CLK and the start pulse signal SP, and outputs the timing signal to each of the latch circuits 32 in the latch circuit portion 41.

A video signal $S_0$ and a latch signal LAT are input to the latch circuit portion 41.

When timing signals are input to the latch circuits 32, the video signals $S_0$ are sampled in response to pulse signals included in the timing signals and sequentially written to the latch circuits 32. A period until writing of the video signals $S_0$ to all of the latch circuits 32 is completed can be referred to as a line period.

When one line period is completed, the video signals held in the latch circuits 32 are written to the latch circuits 33 all at once and held in accordance with a pulse of the latch signal LAT input to each of the latch circuits 33. To the latch circuits 32 that have finished sending the video signals to the latch circuits 33, the next video signals are sequentially written again in accordance with timing signals from the shift register circuit 31. In this second line period, the video signals that have been written to and held in the latch circuits 33 are output to the level shifter circuits 34 in the level shifter circuit portion 42.

When the video signals are input to the level shifter circuits 34 in the level shifter circuit portion 42, the voltage amplitudes of the signals are amplified by the level shifter circuits 34, and then sent to the DAC circuits 35 in the D/A converter portion 43. A group of video signals input to each of the DAC circuits 35 are converted into an analog signal, which is output to the analog buffer circuit portion 44. The video signal input to the analog buffer circuit portion 44 is output to each of the source line SL through each of the analog buffer circuits 36.

The second driver circuit 13 selects the gate lines GL sequentially. The video signal input from the first driver circuit 12 to the display portion 11 through the source line SL is input to each of the pixels PIX connected to the gate line GL selected by the second driver circuit 13.

Note that another circuit that can output a signal whose pulse sequentially shifts may be used instead of the shift register circuit 31.

Modification Example of First Driver Circuit

The first driver circuit 12 shown in FIG. 9 has a structure in which a digital signal is converted into an analog signal to be output to the display portion 11; the use of an analog signal as an input signal further simplifies the structure of the first driver circuit 12.

Figure 10A:
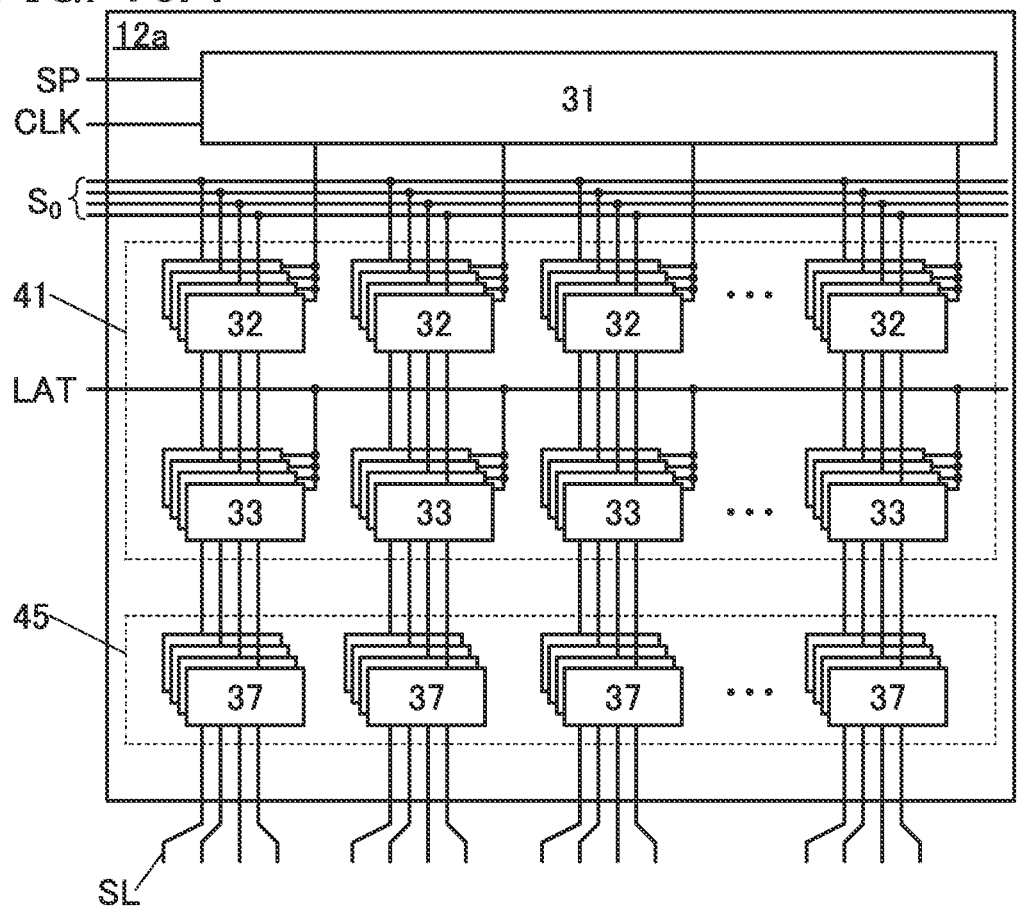
FIGS. 10A and 10B show structure examples of display devices.

A first driver circuit 12a shown in FIG. 10A includes the shift register circuit 31, the latch circuit portion 41, and a source follower circuit portion 45. The source follower circuit portion 45 includes a plurality of source follower circuits 37.

In the latch circuits 32, analog video signals $S_0$ are sampled as analog data in response to timing signals from the shift register circuit 31. The latch circuits 32 output video signals held in the latch circuits 33 all at once in accordance with the latch signal LAT.

The video signals held in the latch circuits 33 are output to one of the source lines SL through the source follower circuit 37. Note that the aforementioned analog buffer circuit may be used instead of the source follower circuit 37.

Figure 10B:
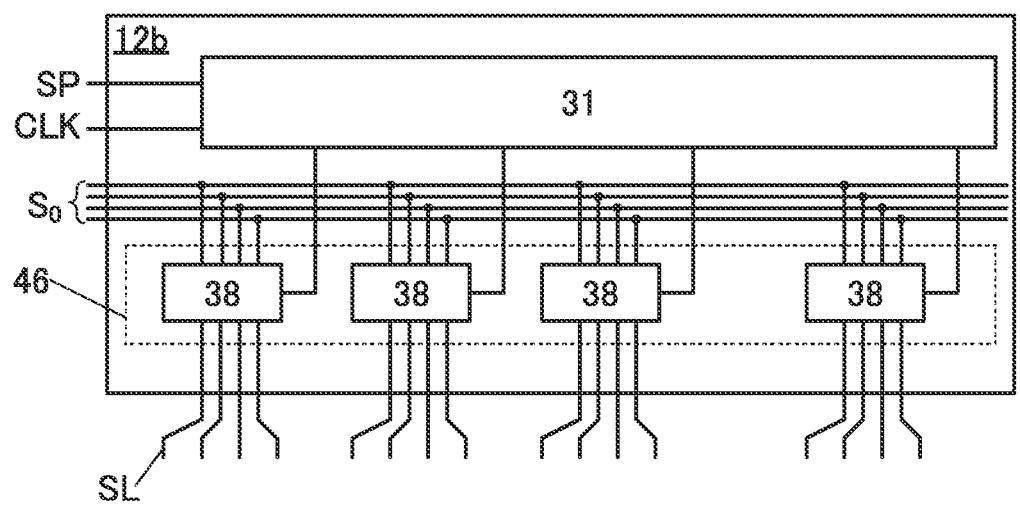

A first driver circuit 12b shown in FIG. 10B includes the shift register circuit 31 and a demultiplexer circuit 46.

The demultiplexer circuit 46 includes a plurality of sampling circuits 38. Each sampling circuit 38 receives a plurality of analog video signals $S_0$ from a plurality of wirings and outputs video signals to a plurality of source lines SL at a time in response to a timing signal input from the shift register circuit 31. The shift register circuit 31 outputs timing signals so as to sequentially select a plurality of sampling circuits 38.

For example, in the case where 2160 source lines SL are connected to the display portion 11 and video signals $S_0$ are supplied from 54 wirings, 40 sampling circuits 38 are provided in the demultiplexer circuit 46, so that one line period can be divided into 40 periods and video signals can be output to 54 source lines SL at a time in each period.

The above is the description of the first driver circuit.

Structure Example of Display Portion

The display portion 11 can have a structure in which a plurality of pixels PIX each including at least a display element and a transistor are arranged in a matrix.

Figure 11:
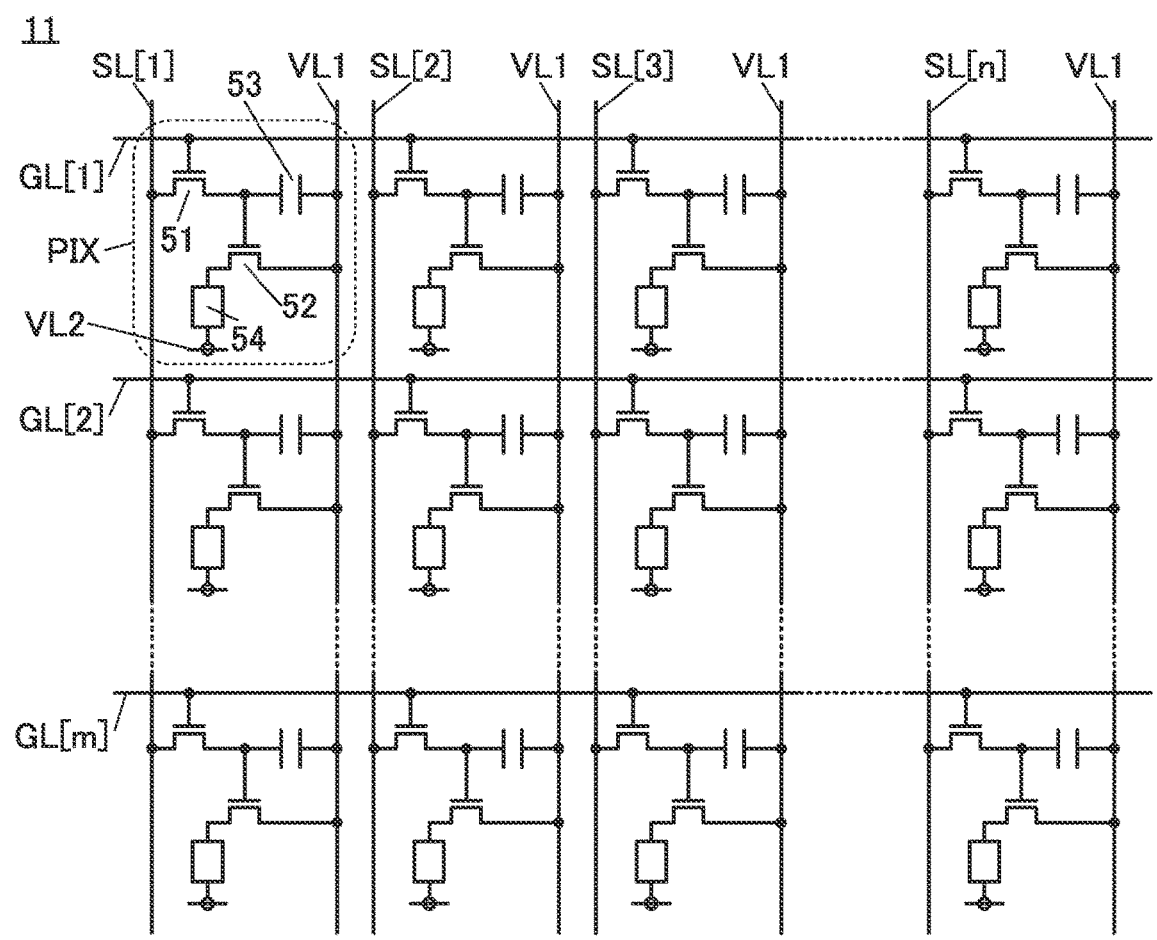
FIG. 11 shows a structure example of a display device.

FIG. 11 shows a circuit diagram example of the display portion 11 including a light-emitting element as a display element. The display portion 11 shown in FIG. 11 is connected to m (m is an integer of 2 or more) gate lines GL and n (n is an integer of 2 or more) source lines SL.

The pixels PIX in the display portion 11 each include a transistor 51, a transistor 52, a capacitor 53, and a light-emitting element 54. The pixels PIX are each connected to the source line SL, the gate line GL, and wirings VL1 and VL2 supplied with a power source potential.

The transistor 100 or the like shown in Embodiment 1 can be applied to the transistors 51 and 52. Note that the transistor 200 or the like shown in Embodiment 1 can be used as one of the transistors 51 and 52 as needed.

A gate of the transistor 51 is connected to the gate line GL, one of a source and a drain of the transistor 51 is connected to the source line SL, and the other thereof is connected to one electrode of the capacitor 53 and a gate of the transistor 52. One of a source and a drain of the transistor 52 is connected to one electrode of the light-emitting element 54 and the other thereof is connected to the wiring VL1. The other electrode of the capacitor 53 is connected to the wiring VL1. The other electrode of the light-emitting element 54 is connected to the wiring VL2.

The pixel PIX is selected by a signal supplied from the gate line GL. A potential is written from the source line SL through the transistor 51 to a node to which the gate of the transistor 52 is connected, and the potential controls current flowing through the light-emitting element 54, thereby controlling the emission luminance of the light-emitting element 54.

As the light-emitting element 54, an organic electroluminescent element (also referred to as an organic EL element) can be typically used, for example. Note that the light-emitting element 54 is not limited thereto and may be an inorganic EL element containing an inorganic material, a light-emitting diode, or the like.

The above is the description of the structure example of the display portion.

Structural Example of Light-Emitting Element

A structure example of a display panel and a light-emitting element will be described below.

Figure 12A:
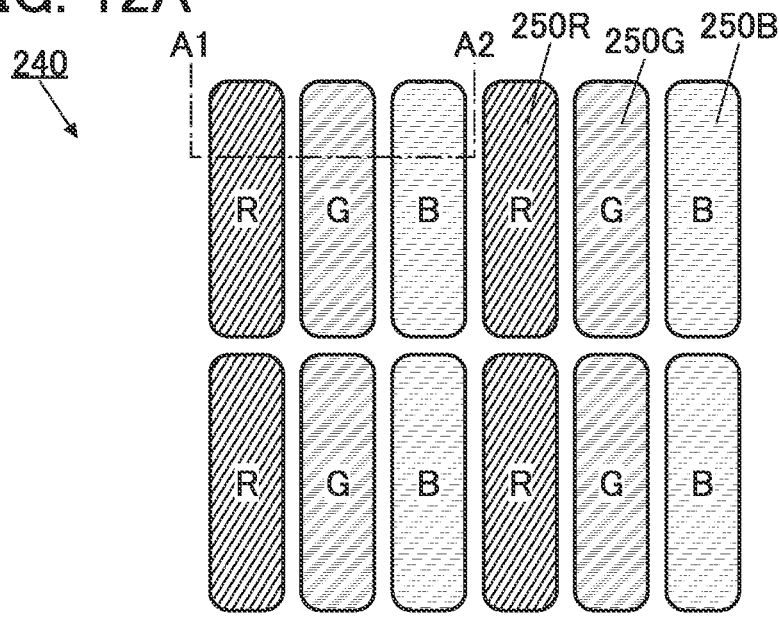
FIGS. 12A to 12C show structure examples of display devices.

FIG. 12A shows a schematic top view of a display device 240 of one embodiment of the present invention. The display device 240 includes a plurality of light-emitting elements 250R exhibiting red, a plurality of light-emitting elements 250G exhibiting green, and a plurality of light-emitting elements 250B exhibiting blue. In FIG. 12A, light-emitting regions of the light-emitting elements are denoted by R, G, and B to easily differentiate the light-emitting elements.

The light-emitting elements 250R, the light-emitting elements 250G, and the light-emitting elements 250B are arranged in a matrix. FIG. 12A shows what is called a stripe arrangement, in which the light-emitting elements with the same color are arranged in one direction. Note the arrangement method of the light-emitting elements is not limited thereto; another method such as a delta, zigzag, or pentile arrangement may also be used.

As the light-emitting elements 250R, 250G, and 250B, an EL element such as an organic light-emitting diode (OLED) or a quantum-dot light-emitting diode (QLED) is preferably used. As a light-emitting substance included in the EL element, a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used.

Figure 12B:
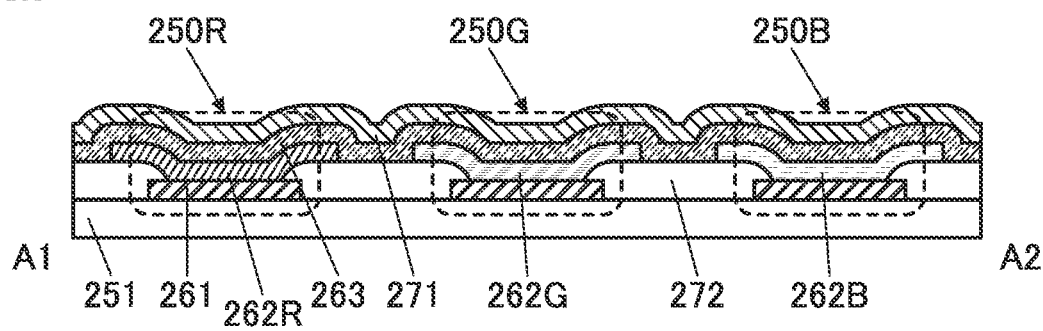

FIG. 12B is a schematic cross-sectional view taken along dashed-dotted line A1-A2 in FIG. 12A.

FIG. 12B shows a cross section of the light-emitting elements 250R, 250G, and 250B. The light-emitting elements 250R, 250G, and 250B are provided over a substrate 251 and include a pixel electrode 261 and a common electrode 263.

The light-emitting element 250R includes an EL layer 262R between the pixel electrode 261 and the common electrode 263. The EL layer 262R includes a light-emitting organic compound that emits light with intensity at least in a red wavelength range. An EL layer 262G of the light-emitting element 250G includes a light-emitting organic compound that emits light with intensity at least in a green wavelength range. An EL layer 262B of the light-emitting element 250B includes a light-emitting organic compound that emits light with intensity at least in a blue wavelength range.

The EL layer 262R, the EL layer 262G, and the EL layer 262B may each include one or more of an electron-injection layer, an electron-transport layer, a hole-injection layer, and a hole-transport layer in addition to the layer containing a light-emitting organic compound (the light-emitting layer).

The pixel electrode 261 is provided for each of the light-emitting elements. The common electrode 263 is provided as a common layer to the light-emitting elements. A conductive film that transmits visible light is used for either the pixel electrode 261 or the common electrode 263, and a reflective conductive film is used for the other. The light-transmitting pixel electrode 261 and the reflective common electrode 263 offer a bottom-emission display device whereas the reflective pixel electrode 261 and the light-transmitting common electrode 263 offer a top-emission display device. Note that when both the pixel electrode 261 and the common electrode 263 transmit light, a dual-emission display device can be obtained.

An insulating layer 272 is provided to cover end portions of the pixel electrode 261. End portions of the insulating layer 272 are preferably tapered.

The EL layer 262R, the EL layer 262G, and the EL layer 262B each include a region in contact with a top surface of the pixel electrode 261 and a region in contact with a surface of the insulating layer 272. End portions of the EL layer 262R, the EL layer 262G, and the EL layer 262B are positioned over the insulating layer 272.

As shown in FIG. 12B, there is a gap between the EL layers of two light-emitting elements with different colors. The EL layer 262R, the EL layer 262G, and the EL layer 262B are thus preferably provided so as not to be in contact with each other. This favorably prevents unintentional light emission (also referred to as crosstalk) from being caused by current flowing through adjacent two EL layers. As a result, the contrast can be increased to achieve a display device with high display quality.

The EL layer 262R, the EL layer 262G, and the EL layer 262B can be formed separately by a vacuum evaporation method or the like using a shadow mask such as a metal mask. These layers may be formed separately by a photolithography method. The use of the photolithography method achieves a display device with high resolution, which is difficult to obtain in the case of using a metal mask.

In this specification and the like, a device fabricated using a metal mask or a fine metal mask (FMM, a high-resolution metal mask) is referred to as a device with a metal mask (MM) structure in some cases. Also in this specification and the like, a device fabricated without using a metal mask or an FMM is referred to as a device with a metal maskless (MML) structure in some cases.

A protective layer 271 is provided over the common electrode 263 so as to cover the light-emitting elements 250R, 250G, and 250B. The protective layer 271 has a function of preventing diffusion of impurities such as water into each light-emitting element from the above.

The protective layer 271 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 271.

Figure 12C:
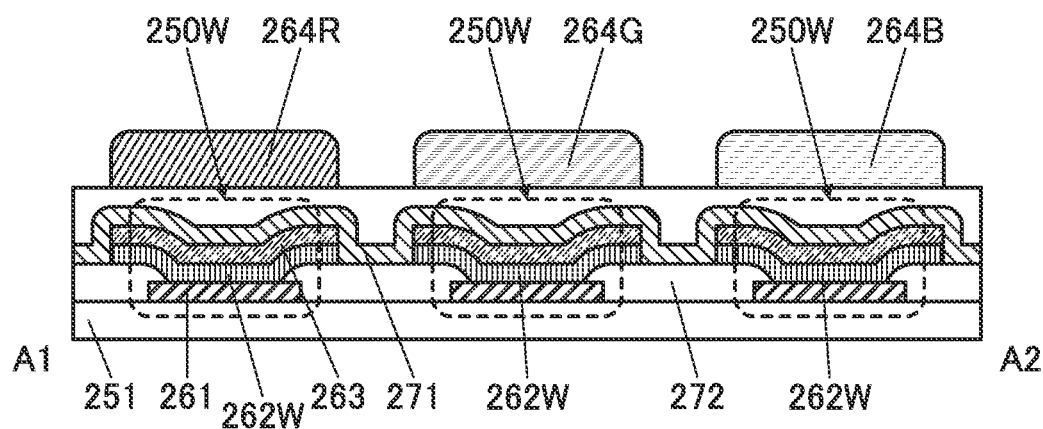

FIG. 12C shows an example different from the above.

In FIG. 12C, a light-emitting element 250W emitting white light is provided. The light-emitting element 250W includes an EL layer 262W emitting white light between the pixel electrode and the common electrode 263.

The EL layer 262W can have, for example, a stacked structure of two or more layers that are selected so as to emit light of complementary colors. It is also possible to use a stacked EL layer in which a charge-generation layer is provided between light-emitting layers.

FIG. 12C shows three light-emitting elements 250W side by side. A coloring layer 264R is provided above the left light-emitting element 250W. The coloring layer 264R functions as a band path filter that transmits red light. Similarly, a coloring layer 264G that transmits green light is provided above the middle light-emitting element 250W, and a coloring layer 264B that transmits blue light is provided above the right light-emitting element 250W. This enables the display device to display color images.

The EL layer 262W and the common electrode 263 are each separated between adjacent two light-emitting elements 250W. This favorably prevents unintentional light emission from being caused by current flowing through the EL layers 262W of adjacent two light-emitting elements 250W. Particularly when the EL layer 262W is a stacked EL layer in which a charge-generation layer is provided between two light-emitting layers, the effect of crosstalk is more significant as the resolution increases, i.e., as the distance between adjacent pixels decreases, leading to lower contrast. Thus, the above structure can achieve a display device having high resolution and contrast.

The EL layer 262W and the common electrode 263 are preferably separated by a photolithography method. This can reduce the distance between light-emitting elements, achieving a display device with higher aperture ratio than that is formed using, for example, a shadow mask such as a metal mask.

Note that in the case of a bottom-emission light-emitting element, the coloring layers may be provided between the pixel electrode 261 and the substrate 251.

The above is the description of the light-emitting elements.

At least parts of the structure examples, the drawings corresponding thereto, and the like described in this embodiment can be combined with any of the other structure examples, the other drawings, and the like as appropriate.

Embodiment 3

Described in this embodiment are structure examples of a display device that can be manufactured using a transistor of one embodiment of the present invention.

Figure 13A:
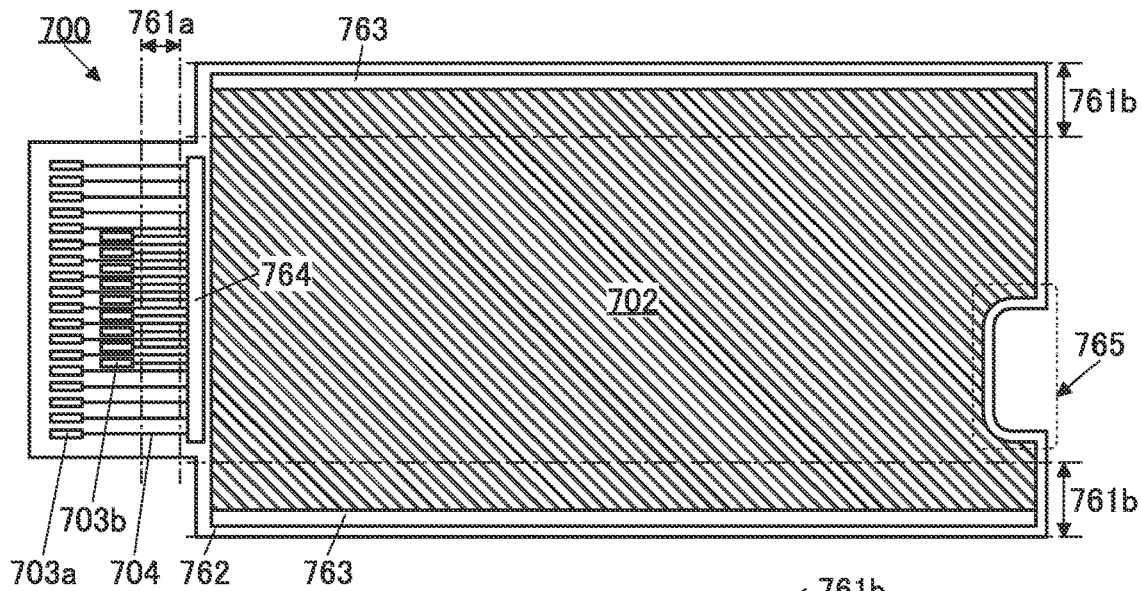
FIGS. 13A to 13C show a structure example of a display device.

FIG. 13A is a schematic top view of a display device 700. The display device 700 includes a substrate 762 having flexibility. The substrate 762 is provided with a display portion 702, a pair of circuit portions 763, a circuit portion 764, wirings 704, connection terminals 703a, and connection terminals 703b.

The circuit portions 763 and the circuit portion 764 have a function of driving the display portion 702. Two circuit portions 763 are provided with the display portion 702 therebetween. The circuit portion 764 is provided between the display portion 702 and the wiring 704. The circuit portions 763 have a function of a gate driver, for example, and the circuit portion 764 has a function of a source driver or a part of the source driver, for example. For example, the circuit portion 764 may include a buffer circuit or a demultiplexer circuit.

As a display element provided in the display portion 702, the above-described variety of display elements such as a liquid crystal element and a light-emitting element can be used. In particular, an organic EL element is preferably used as the display element.

The substrate 762 has a top surface shape in which a portion where the wiring 704, the connection terminal 703a, and the connection terminal 703b are provided projects from the other portion. In other words, the width of the portion of the substrate 762 is smaller than the width of a portion of the substrate 762 over which the display portion 702 is provided.

The projecting portion of the substrate 762 includes a region that can be bent (a bent portion 761a) in a region overlapping with the wirings 704. Moreover, the substrate 762 includes a pair of regions that can be bent (bent portions 761b) in a region over which the display portion 702 is provided. As shown in FIG. 13A, owing to the projecting shape of the portion of the substrate 762, the bending direction of the bent portion 761a can intersect with the bending direction of the bent portions 761b.

The connection terminal 703a functions as a terminal to which a flexible printed circuit (FPC) is connected, and the connection terminal 703b functions as a terminal to which an IC is connected.

Figure 13B:
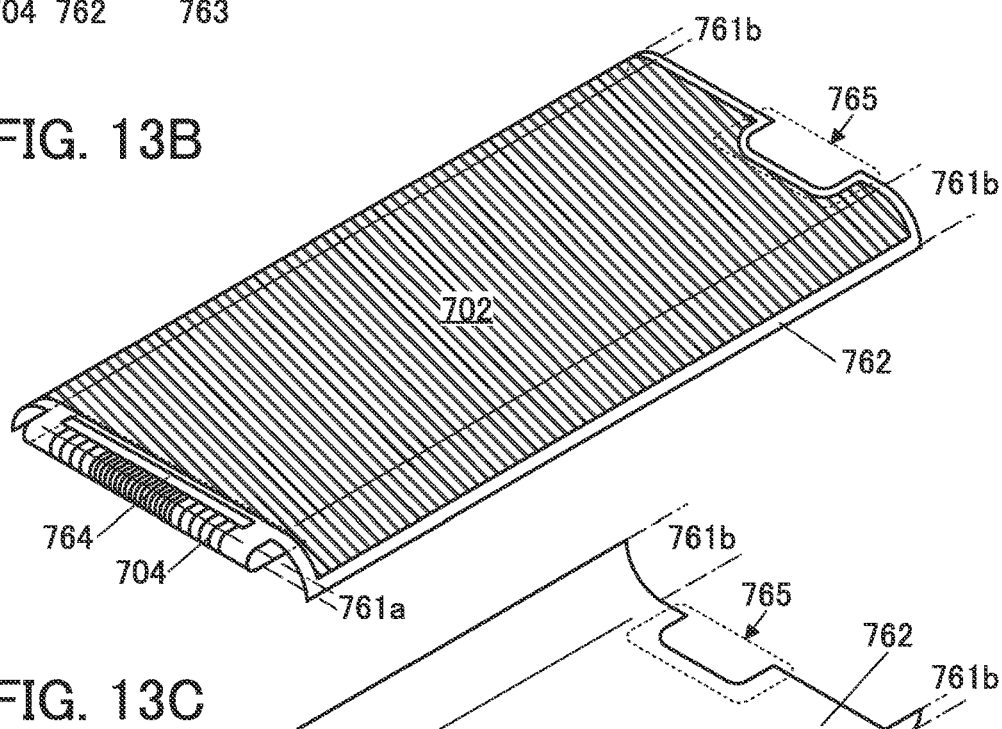
Figure 13C:
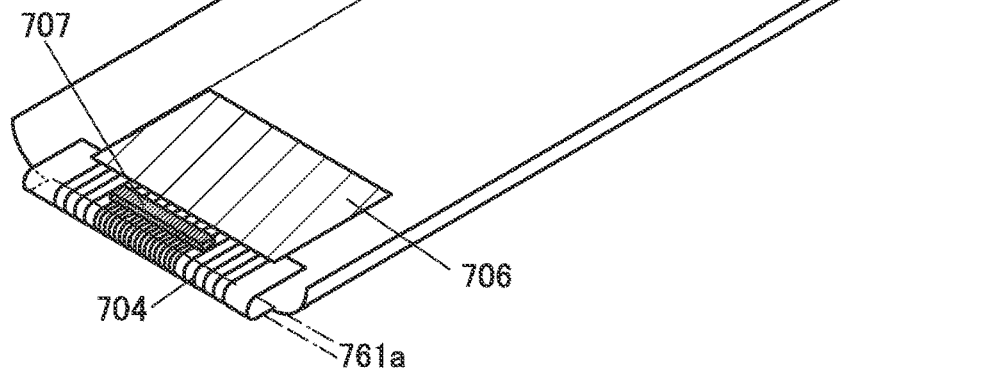

FIGS. 13B and 13C are perspective views of the display device 700 in the case where the substrate 762 is bent at the bent portion 761a and the bent portion 761b to a side opposite to the display surface side. FIG. 13B is a perspective view including the display surface side, and FIG. 13C is a perspective view including the side opposite to the display surface side. FIG. 13C illustrates an FPC 706 connected to the connection terminal 703a and an IC 707 connected to the connection terminal 703b.

When both sides of the display portion 702 are bent as shown in FIG. 13B, at the time of incorporating the display device 700 in an electronic device, bent display portions can be provided on both sides of the electronic device. Thus, a highly functional electronic device can be achieved.

As shown in FIGS. 13B and 13C, the bent portion 761a allows a part of the substrate 762 to be folded back to the side opposite to the display surface side. Specifically, the projecting portion of the substrate 762 can be folded back so that the wirings 704 are on an outer side. Accordingly, the connection terminals 703a and the connection terminals 703b can be placed on the side opposite to the display surface side; furthermore, the FPC 706 can be placed on the side opposite to the display surface side. Thus, the area of a non-display portion can be reduced when the display device 700 is incorporated in an electronic device.

A notch 765 is provided in the substrate 762. The notch 765 is a portion in which, for example, a lens of a camera included in an electronic device, a variety of sensors such as an optical sensor, a lighting device, a design, or the like can be placed. Owing to the notch of a part of the display portion 702, a further highly designed electronic device can be provided. It is also possible to increase the screen occupation ratio with respect to the surface of a housing.

Cross-Sectional Structure Examples

Examples of a cross-sectional structure of the display device will be described below.

Structure Example 1

Figure 14:
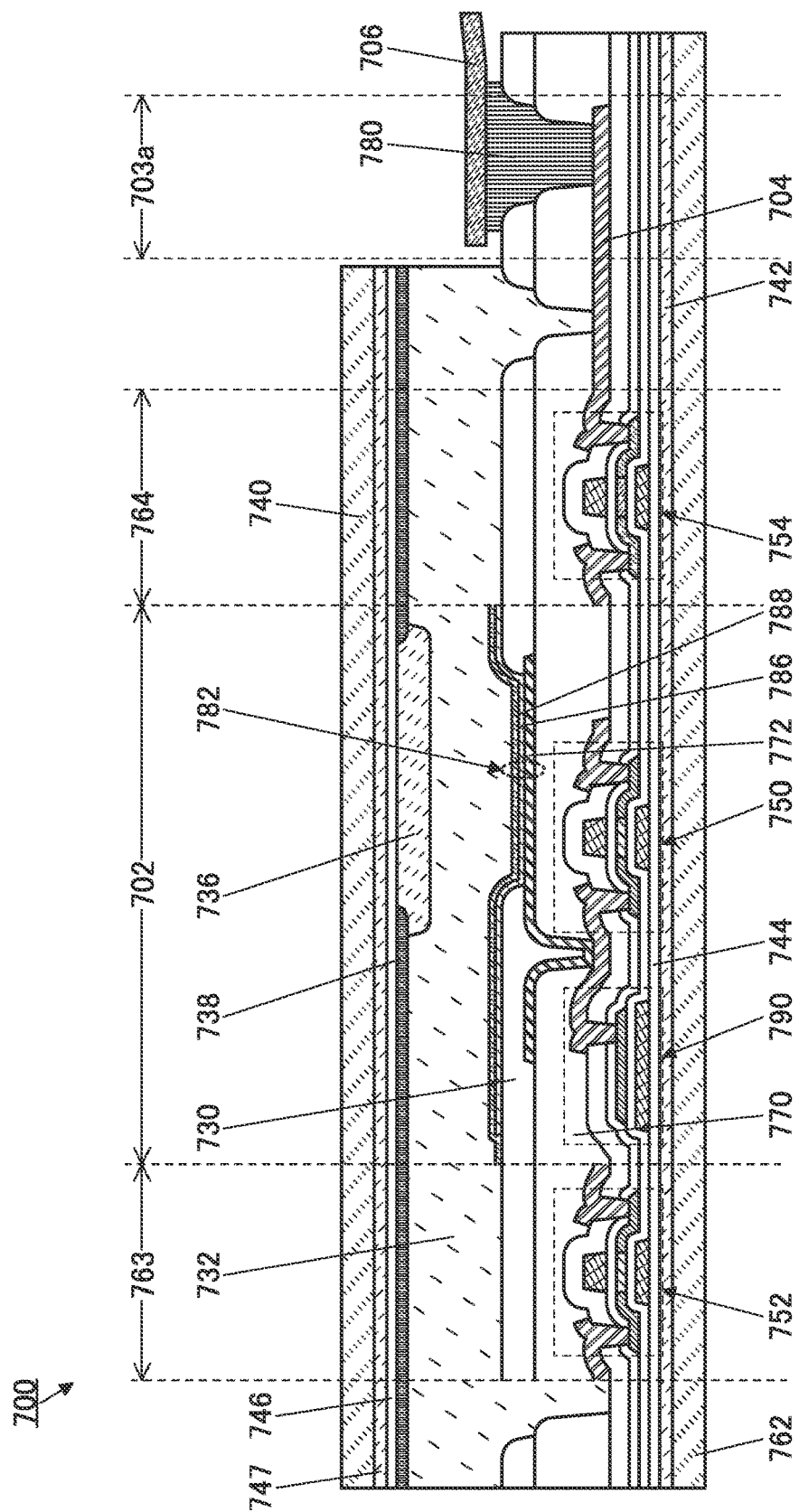
FIG. 14 shows a cross-sectional structure example of a display device.

FIG. 14 is a schematic cross-sectional view of the display device 700. FIG. 14 shows a cross section including the display portion 702, the circuit portions 763 and 764, and the connection terminal 703a in the display device 700 shown in FIG. 13A. A transistor 750 and a capacitor 790 are provided in the display portion 702. A transistor 752 is provided in the circuit portion 763. A transistor 754 is provided in the circuit portion 764.

The transistor 100 or the like described in Embodiment 1 can be used as the transistors 750 and 752. The transistor 200 or the like described in Embodiment 1 can be used as the transistor 754.

The transistor used in this embodiment includes a highly purified oxide semiconductor layer in which formation of oxygen vacancies is suppressed. The transistor can have an extremely low off-state current. Accordingly, in the pixel employing such a transistor, an electrical signal such as an image signal can be held for a longer period, and the interval between operations of writing an image signal or the like can be set longer. Thus, the frequency of refresh operation can be reduced, which leads to lower power consumption.

In addition, the transistor used in this embodiment can have relatively high field-effect mobility and thus is capable of high-speed operation. For example, with such a high-speed transistor used for a display device, a switching transistor in a pixel and a driver transistor in a circuit portion can be formed over one substrate. That is, a driver circuit formed using a silicon wafer or the like does not need to be used, in which case the number of components of the display device can be reduced. Moreover, the use of the high-speed transistor also in the pixel can provide a high-quality image.

The capacitor 790 includes a lower electrode formed by processing the same film as a film used for a first gate electrode of the transistor 750 and an upper electrode formed by processing the same metal oxide film as a film used for the semiconductor layer. The resistance of the upper electrode is reduced as well as those of a source region and a drain region of the transistor 750. A part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor 750 is connected to the upper electrode.

An insulating layer 770 functioning as a planarization film is provided over the transistor 750, the transistor 752, the transistor 754, and the capacitor 790.

The transistor 750 in the display portion 702, the transistor 752 in the circuit portion 763, and the transistor 754 in the circuit portion 764 may have different structures. For example, a top-gate transistor may be used as one of the transistors, and a bottom-gate transistor may be used as any other of them.

Note that the above description in Embodiment 1 can be referred to for the structures of the transistors 750, 752, and 754.

The connection terminal 703a includes a part of the wiring 704. The connection terminal 703a is electrically connected to the FPC 706 through a connection layer 780. As the connection layer 780, for example, an anisotropic conductive material or the like can be used.

The display device 700 includes the substrate 762 and a substrate 740, each of which functions as a support substrate. As the substrates 762 and 740, a glass substrate or a substrate having flexibility such as a plastic substrate can be used, for example.

The transistors 750, 752, and 754, the capacitor 790, and the like are provided over an insulating layer 744. The substrate 762 and the insulating layer 744 are bonded to each other with an adhesive layer 742.

The display device 700 includes a light-emitting element 782, a coloring layer 736, a light-blocking layer 738, and the like.

The light-emitting element 782 includes a conductive layer 772, an EL layer 786, and a conductive layer 788. The conductive layer 772 is electrically connected to the source electrode or the drain electrode of the transistor 750. The conductive layer 772 is provided over the insulating layer 770 and functions as a pixel electrode. An insulating layer 730 is provided to cover an end portion of the conductive layer 772. Over the insulating layer 730 and the conductive layer 772, the EL layer 786 and the conductive layer 788 are stacked.

A material having a property of reflecting visible light can be used for the conductive layer 772. For example, a material containing aluminum, silver, or the like can be used. For the conductive layer 788, a material that transmits visible light can be used. For example, an oxide material containing indium, zinc, tin, or the like is preferably used. Thus, the light-emitting element 782 is a top-emission light-emitting element, which emits light to the side opposite to the formation surface (the substrate 740 side).

The EL layer 786 contains an organic compound or an inorganic compound such as quantum dots. The EL layer 786 contains a light-emitting material that exhibits light when current flows.

As the light-emitting material, a fluorescent material, a phosphorescent material, a thermally activated delayed fluorescent (TADF) material, an inorganic compound (e.g., a quantum dot material), or the like can be used. Examples of materials that can be used for quantum dots include a colloidal quantum dot material, an alloyed quantum dot material, a core-shell quantum dot material, and a core quantum dot material.

The light-blocking layer 738 and the coloring layer 736 are provided on one surface of an insulating layer 746. The coloring layer 736 is provided in a position overlapping with the light-emitting element 782. The light-blocking layer 738 is provided in a region of the display portion 702 that does not overlap with the light-emitting element 782. The light-blocking layer 738 may also be provided to overlap with the circuit portion 763 or the like.

The substrate 740 is bonded to the other surface of the insulating layer 746 with an adhesive layer 747. The substrate 740 and the substrate 762 are bonded to each other with a sealing layer 732.

Here, for the EL layer 786 included in the light-emitting element 782, a light-emitting material that exhibits white light emission is used. White light emission by the light-emitting element 782 is colored by the coloring layer 736 to be emitted to the outside. The EL layer 786 is provided over the pixels that exhibit different colors. The pixels provided with the coloring layer 736 transmitting any of red (R), green (G), and blue (B) are arranged in a matrix in the display portion 702, whereby the display device 700 can perform full-color display.

Shown here is an example in which the EL layer 786 is partly divided. This favorably hinders unintentional light emission from being caused by current flowing through the EL layers 786 of adjacent pixels.

A conductive film having a transmissive property and a reflective property may be used for the conductive layer 788. In this case, a microcavity structure is achieved between the conductive layer 772 and the conductive layer 788 such that light of a specific wavelength can be intensified to be emitted. Also in this case, an optical adjustment layer for adjusting an optical distance may be placed between the conductive layer 772 and the conductive layer 788 such that the thickness of the optical adjustment layer differs between pixels of different colors, whereby the color purity of light emitted from each pixel can be increased.

Note that the coloring layer 736 and the aforementioned optical adjustment layer are not necessarily provided when the EL layer 786 is formed into an island shape for each pixel or into a stripe shape for each pixel column, i.e., the EL layer 786 is formed by separate coloring.

Here, an inorganic insulating film that functions as a barrier film having low permeability is preferably used for each of the insulating layers 744 and 746. With such a structure in which the light-emitting element 782, the transistor 750, and the like are interposed between the insulating layer 744 and the insulating layer 746, deterioration of them can be inhibited and a highly reliable display device can be achieved.

At least parts of the structure examples, the drawings corresponding thereto, and the like described in this embodiment can be combined with any of the other structure examples, the other drawings, and the like as appropriate.

Embodiment 4

In this embodiment, examples of a head-mounted display including a display device will be described as an example of an electronic device of one embodiment of the present invention.

Figure 15A:
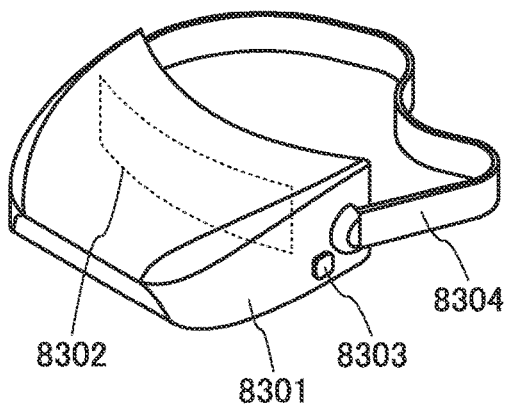
FIGS. 15A to 15F show structure examples of electronic devices.
Figure 15B:
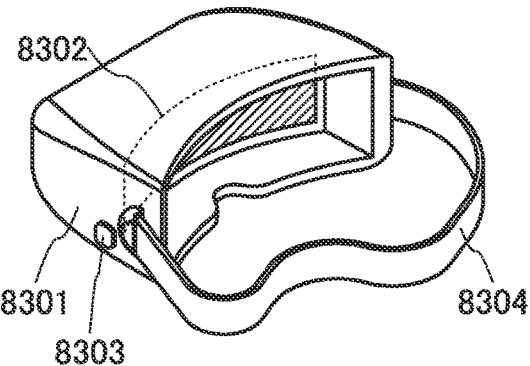

FIGS. 15A and 15B are external views of a head-mounted display 8300.

The head-mounted display 8300 includes a housing 8301, a display portion 8302, an operation button 8303, and a band-like fixing member 8304.

The operation button 8303 functions as a power button or the like. Another button may be provided in addition to the operation button 8303.

Figure 15C:
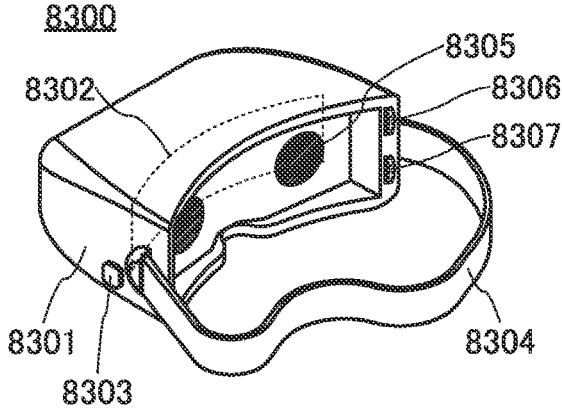

As shown in FIG. 15C, lenses 8305 may be provided between the display portions 8302 and the user's eyes. The user can see magnified images on the display portions 8302 through the lenses 8305, thereby having a more realistic sensation. In this case, as shown in FIG. 15C, a dial 8306 for changing the position of the lenses and adjusting visibility may be provided.

The display device of one embodiment of the present invention can be used for the display portion 8302. Since the display device of one embodiment of the present invention has an extremely high resolution, even when images are magnified using the lenses 8305 as shown in FIG. 15C, the user does not perceive pixels, and thus, more realistic images can be displayed.

FIGS. 15A to 15C show examples in which the head-mounted display includes one display portion 8302. Such a structure can reduce the number of components.

The display portion 8302 can display an image for the right eye and an image for the left eye side by side on a right region and a left region, respectively. Thus, a three-dimensional image using binocular disparity can be displayed.

One image which can be seen with both eyes may be displayed on the entire display portion 8302. Thus, a panorama image can be displayed from end to end of the field of view, which can provide a higher sense of reality.

Here, the head-mounted display 8300 preferably has a mechanism for optimizing the curvature of the display portion 8302 in accordance with the size of the user's head, the position of the user's eyes, or the like. For example, the user himself/herself may adjust the curvature of the display portion 8302 by operating a dial 8307 for adjusting the curvature of the display portion 8302. Alternatively, the head-mounted display 8300 may include a sensor for detecting the size of the user's head, the position of the user's eyes, or the like (e.g., a camera, a contact sensor, and a noncontact sensor) on the housing 8301 and have a mechanism for adjusting the curvature of the display portion 8302 on the basis of data detected by the sensor.

In the case where the lenses 8305 are used, the head-mounted display 8300 preferably has a mechanism for adjusting the position and angle of the lenses 8305 in synchronization with the curvature of the display portion 8302. Alternatively, the dial 8306 may have a function of adjusting the angle of the lenses.

Figure 15D:
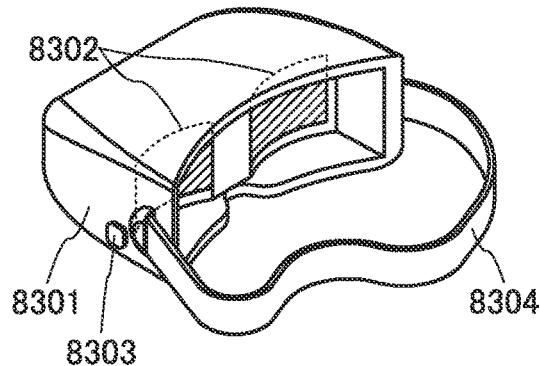
Figure 15E:
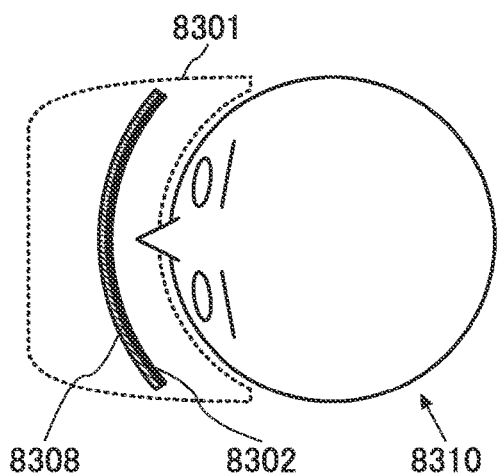
Figure 15F:
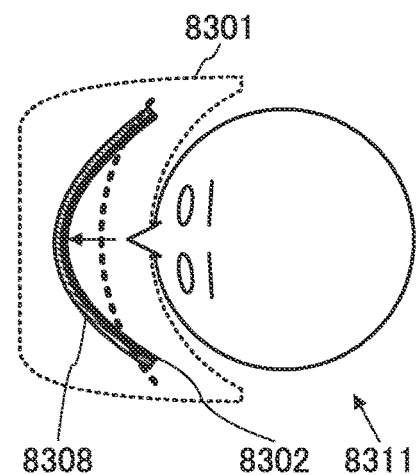

FIGS. 15E and 15F show an example of including a driver portion 8308 that controls the curvature of the display portion 8302. The driver portion 8308 is fixed to at least a part of the display portion 8302. The driver portion 8308 has a function of changing the shape of the display portion 8302 when the part of the driver portion 8308 that is fixed to the display portion 8302 changes in shape or moves.

FIG. 15E is a schematic view showing the case where a user 8310 having a relatively large head wears the housing 8301. In that case, the driver portion 8308 adjusts the shape of the display portion 8302 so that the curvature is relatively small (the radius of curvature is large).

In contrast, FIG. 15F shows the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature is large (the radius of curvature is small). In FIG. 15F, the position and shape of the display portion 8302 in FIG. 15E are denoted by a dashed line.

When the head-mounted display 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by vibrating the curvature of the display portion 8302. In this way, it is possible to produce various effects according to the scene in contents, and provide the user with new experiences. A further realistic display can be provided in conjunction with a vibration module provided in the housing 8301.

Note that the head-mounted display 8300 may include two display portions 8302 as shown in FIG. 15D.

When the two display portions 8302 are provided, the user's eyes can see their respective display portions. This allows a high-resolution image to be displayed even when a three-dimensional display using parallax or the like is performed. In addition, the display portion 8302 is curved around an arc with an approximate center at the user's eye. This keeps a certain distance between the user's eye and the display surface of the display portion, enabling the user to see a more natural image. Furthermore, the user's eye is positioned in the normal direction of the display surface of the display portion; therefore, even when the luminance or chromaticity of light from the display portion is changed with the viewing angle, the influence of the change can be substantially ignorable and thus a more realistic image can be displayed.

At least parts of the structure examples, the drawings corresponding thereto, and the like described in this embodiment can be combined with any of the other structure examples, the other drawings, and the like as appropriate.

Embodiment 5

In this embodiment, a display module that can be fabricated using one embodiment of the present invention will be described.

Figure 16A:
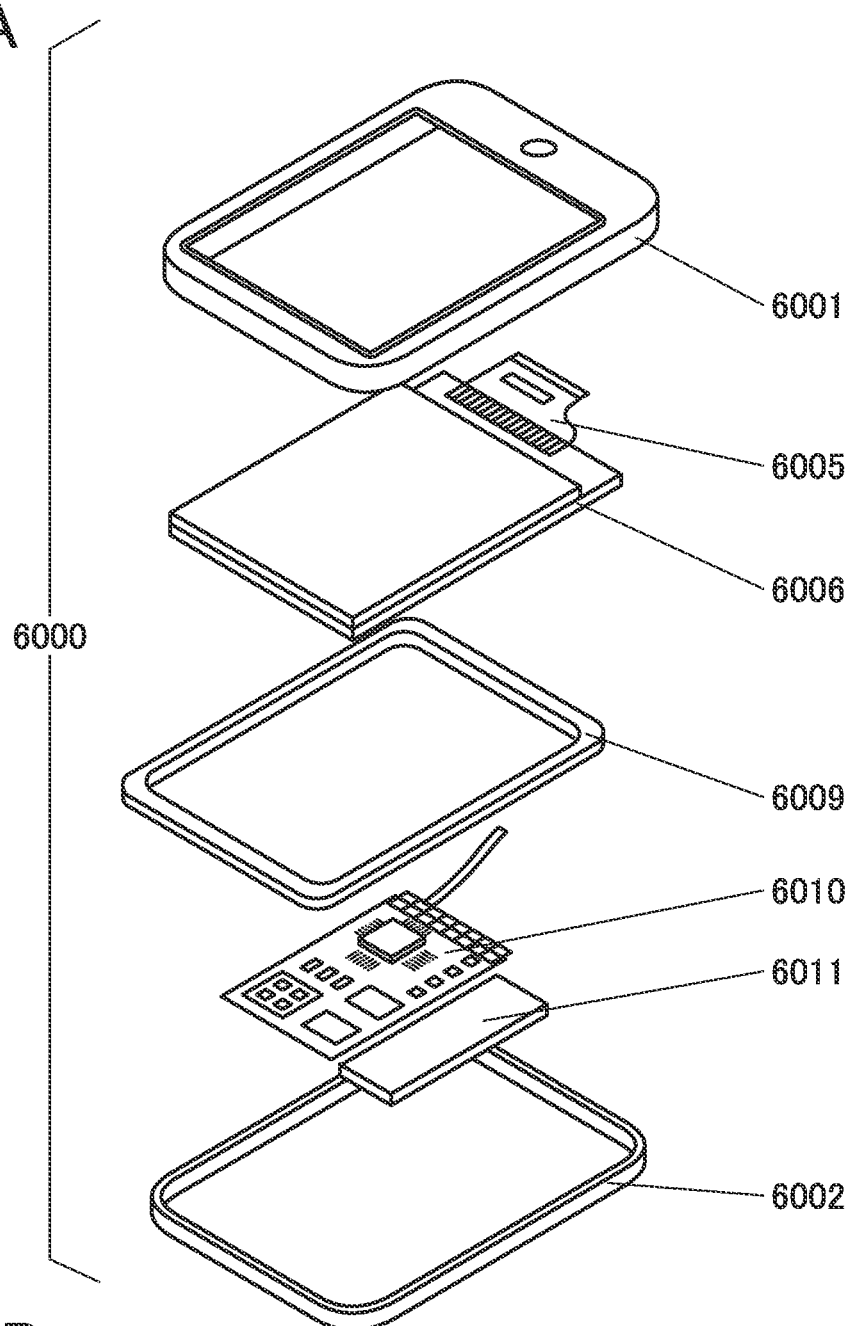
FIGS. 16A and 16B show a structure example of a display module.

In a display module 6000 in FIG. 16A, a display device 6006 connected to an FPC 6005, a frame 6009, a printed circuit board 6010, and a battery 6011 are provided between an upper cover 6001 and a lower cover 6002.

For example, the display device fabricated using one embodiment of the present invention can be used as the display device 6006. With the display device 6006, a display module with extremely low power consumption can be achieved.

The shapes and sizes of the upper cover 6001 and the lower cover 6002 can be changed as appropriate in accordance with the size of the display device 6006.

The display device 6006 may function as a touch panel.

The frame 6009 may have a function of protecting the display device 6006 or blocking electromagnetic waves generated by the operation of the printed circuit board 6010, or function as a radiator plate, for example.

The printed circuit board 6010 includes a power supply circuit, a signal processing circuit for outputting a video signal and a clock signal, a battery control circuit, and the like.

Figure 16B:
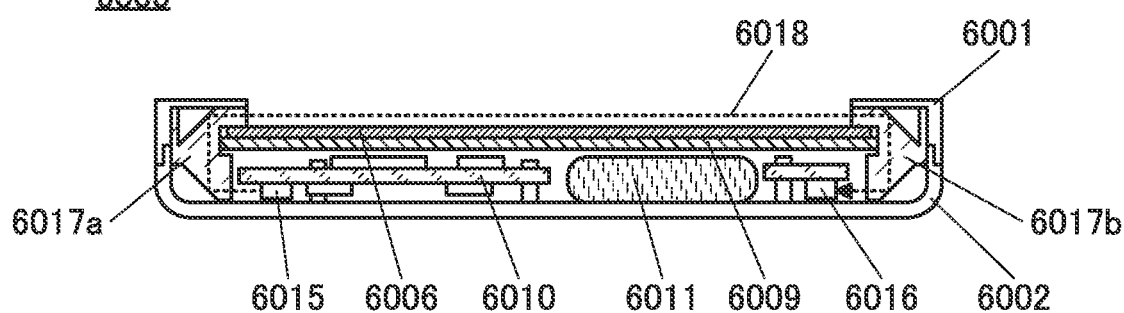

FIG. 16B is a schematic cross-sectional view of the display module 6000 with an optical touch sensor.

The display module 6000 includes a light-emitting portion 6015 and a light-receiving portion 6016 which are provided on the printed circuit board 6010. A pair of light guide portions (a light guide portion 6017a and a light guide portion 6017b) is provided in a region surrounded by the upper cover 6001 and the lower cover 6002.

The display device 6006 overlaps with the printed circuit board 6010 and the battery 6011 with the frame 6009 located therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display device 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light. As the light-receiving portion 6016, a photoelectric element that receives light emitted by the light-emitting portion 6015 and converts it into an electrical signal can be used. A photodiode that can receive infrared light can be favorably used.

With the use of the light guide portions 6017a and 6017b transmitting the light 6018, the light-emitting portion 6015 and the light-receiving portion 6016 can be placed under the display device 6006, and a malfunction of the touch sensor due to external light reaching the light-receiving portion 6016 can be inhibited. It is particularly preferable to use a resin that absorbs visible light and transmits infrared light, in which case the malfunction of the touch sensor can be inhibited more effectively.

At least a part of this embodiment can be implemented in combination with any of the other embodiments described in this specification as appropriate.

Embodiment 6

In this embodiment, examples of an electronic device to which the display device of one embodiment of the present invention can be applied will be described.

Figure 17A:
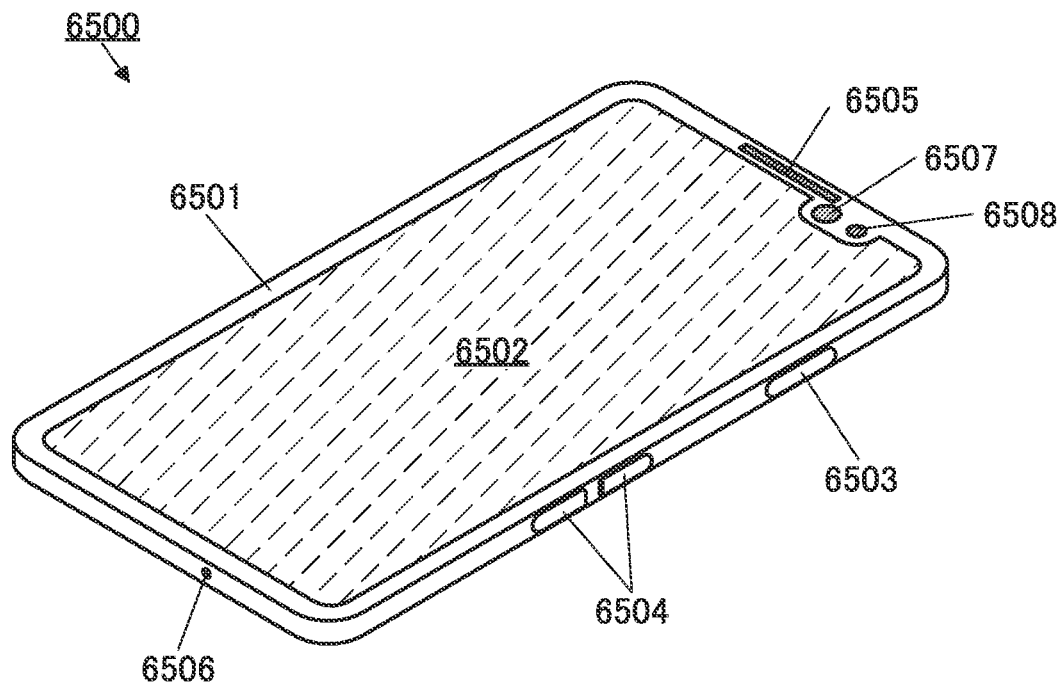
FIGS. 17A and 17B show a structure example of an electronic device.

An electronic device 6500 in FIG. 17A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 17B:
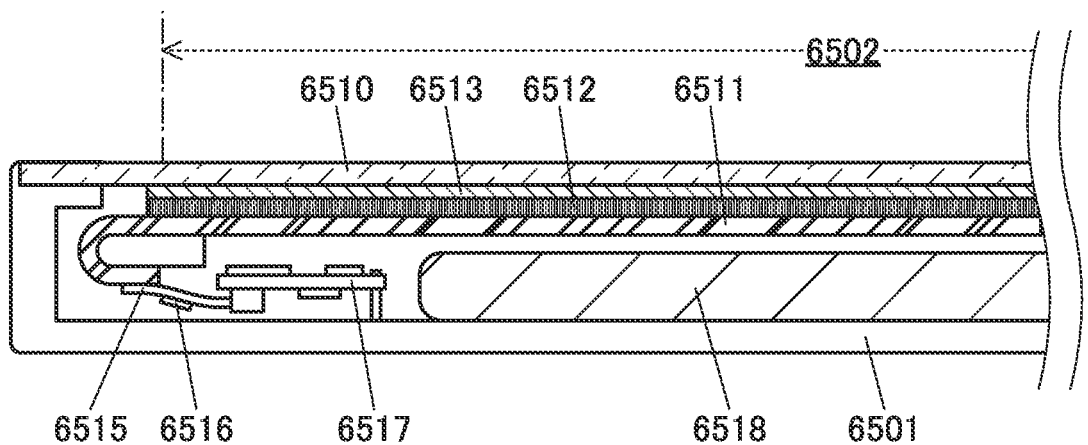

FIG. 17B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

A part of the display panel 6511 is folded back in a region outside the display portion 6502. An FPC 6515 is connected to the folded part. An IC 6516 is mounted on the FPC 6515. The FPC 6515 is connected to a terminal provided on the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be mounted without an increase in the thickness of the electronic device. Moreover, a part of the display panel 6511 is folded back so that a connection portion with the FPC 6515 is provided on the back side of the pixel portion, whereby an electronic device with a narrow bezel can be achieved.

At least a part of this embodiment can be implemented in combination with any of the other embodiments described in this specification as appropriate.

Embodiment 7

In this embodiment, electronic devices each including a display device fabricated using one embodiment of the present invention will be described.

Electronic devices described below are each provided with a display device of one embodiment of the present invention in a display portion. Thus, the electronic devices achieve high resolution. In addition, the electronic devices can achieve both high resolution and a large screen.

One embodiment of the present invention includes the display device and at least one of an antenna, a battery, a housing, a camera, a speaker, a microphone, a touch sensor, and an operation button.

The electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, or the like on a display portion. When the electronic device includes an antenna and a secondary battery, the antenna may be used for contactless power transmission.

The display portion of the electronic device of one embodiment of the present invention can display, for example, an image with full high definition, 4K2K, 8K4K, 16K8K, or higher definition.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game console; a portable information terminal; an audio reproducing device; and the like.

The electronic device using one embodiment of the present invention can be incorporated along a flat surface or a curved surface of an inside or outside wall surface of a house or a building, an interior or exterior surface of a car, or the like.

Figure 18A:
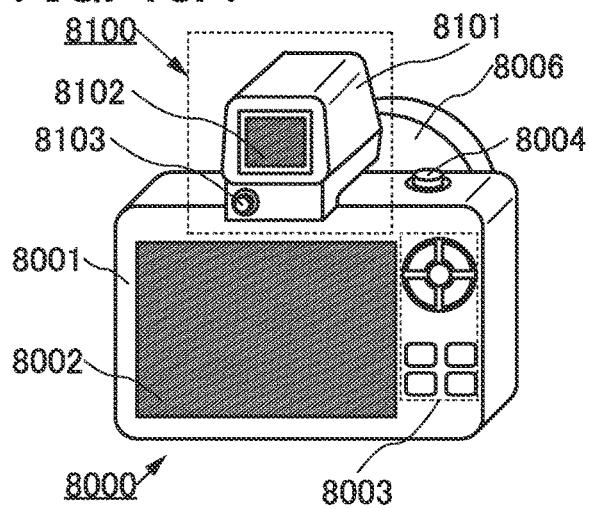
FIGS. 18A to 18E show structure examples of electronic devices.

FIG. 18A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 18B:
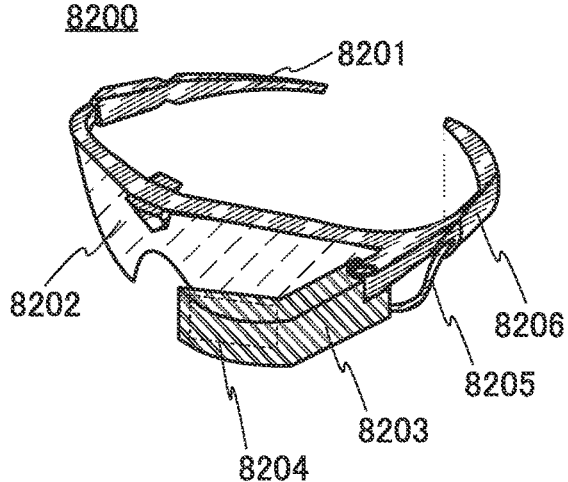

FIG. 18B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with the use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

Figure 18C:
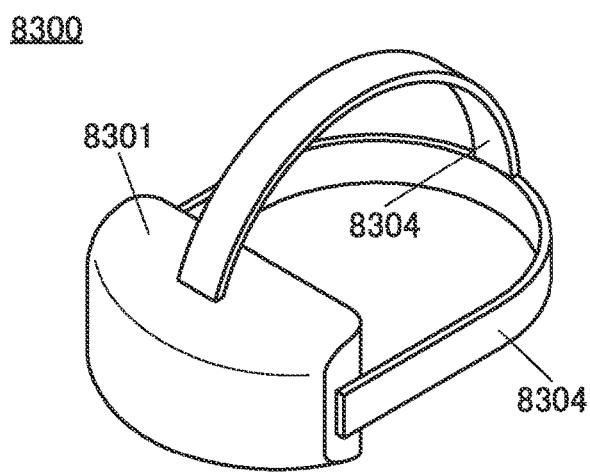
Figure 18D:
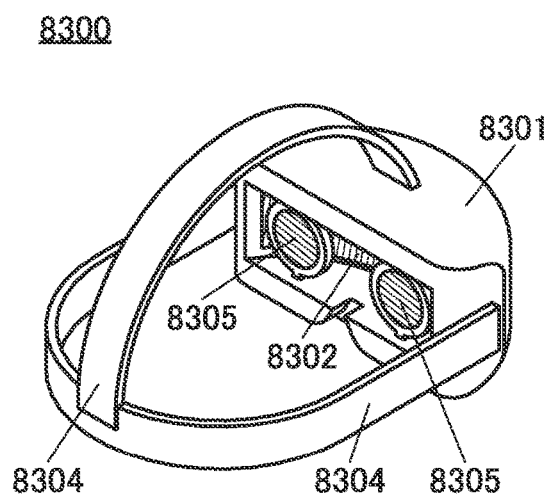
Figure 18E:
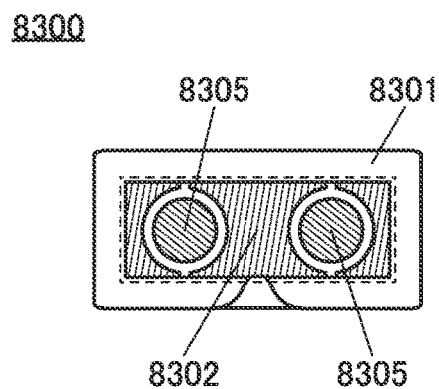

FIGS. 18C to 18E are external views of the head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

A display device of one embodiment of the present invention can be used in the display portion 8302. A display device including a semiconductor device of one embodiment of the present invention has an extremely high resolution; thus, even when an image is magnified using the lenses 8305 as shown in FIG. 18E, the user does not perceive pixels, and thus a more realistic image can be displayed.

Electronic devices shown in FIGS. 19A to 19G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices shown in FIGS. 19A to 19G have a variety of functions, such as a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of reading a program or data stored in a storage medium and processing the program or data, and the like. Note that the electronic devices can have a variety of functions without limitation to the above. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices shown in FIGS. 19A to 19G are described in detail below.

Figure 19A:
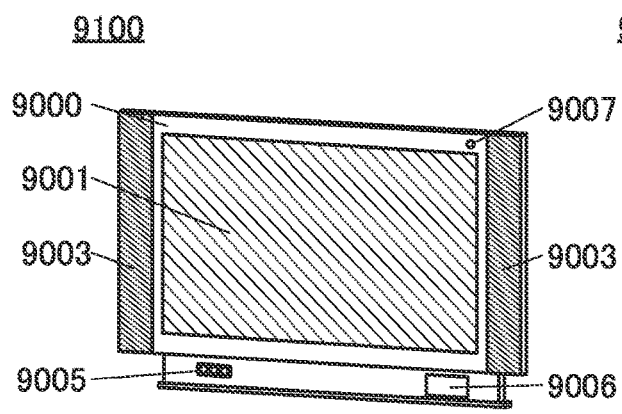
FIGS. 19A to 19G show structure examples of electronic devices.

FIG. 19A is a perspective view showing a television device 9100. The television device 9100 can include the display portion 9001 having a large screen size of, for example, 50 inches or more, or 100 inches or more.

Figure 19B:
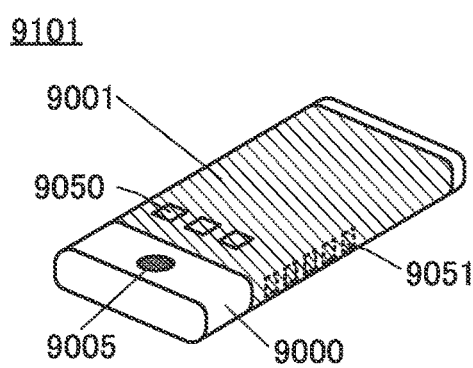

FIG. 19B is a perspective view of a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. In FIG. 19B, three icons 9050 are displayed as an example. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 19C:
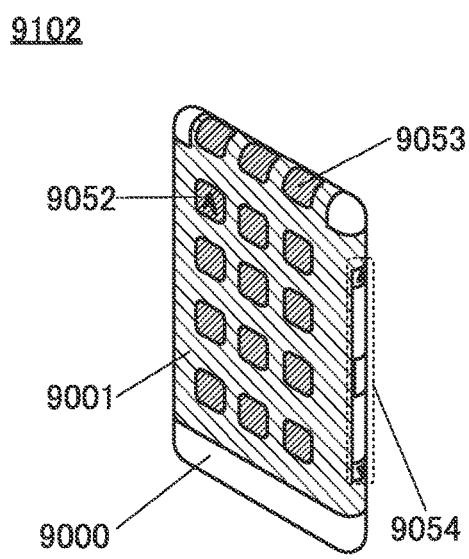

FIG. 19C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 19D:
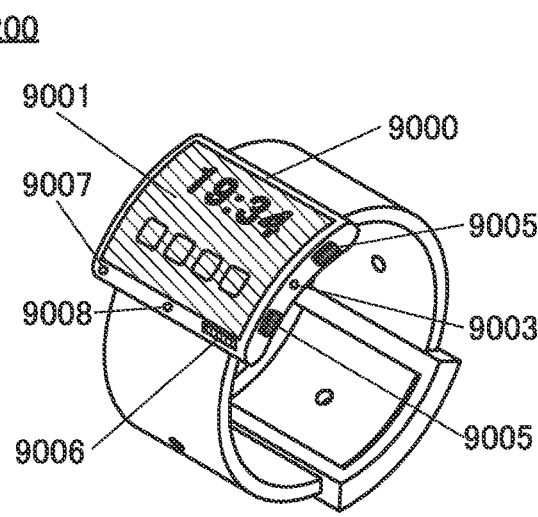

FIG. 19D is a perspective view of a watch-type portable information terminal 9200. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. The connection terminal 9006 of the portable information terminal 9200 allows mutual data transmission with another information terminal and charging. Note that the charging operation may be performed by wireless power feeding.

Figure 19E:
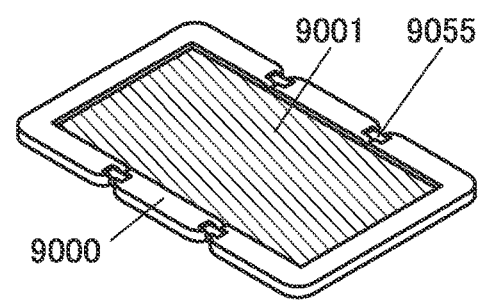
Figure 19F:
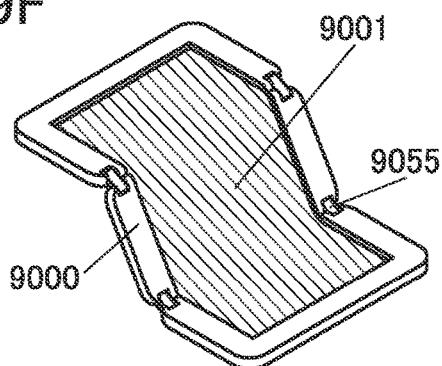
Figure 19G:
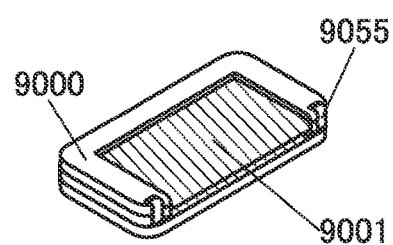

FIGS. 19E to 19G are perspective views of a foldable portable information terminal 9201. FIG. 19E is a perspective view showing the portable information terminal 9201 that is opened; FIG. 19G, the portable information terminal 9201 that is folded; and FIG. 19F, the portable information terminal 9201 that is shifted from one of the states in FIGS. 19E and 19G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be bent with a radius of curvature of greater than or equal to 1 mm and less than or equal to 150 mm.

Figure 20A:
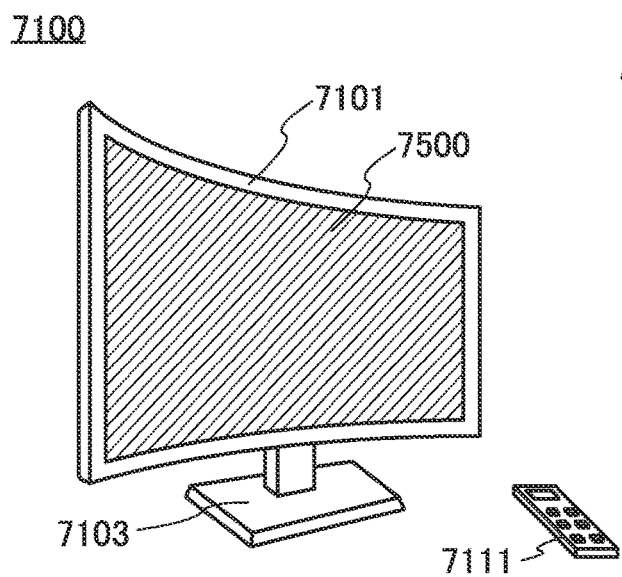
FIGS. 20A to 20D show structure examples of electronic devices.

FIG. 20A shows an example of a television device. In a television device 7100, a display portion 7500 is incorporated in a housing 7101. Here, the housing 7101 is supported by a stand 7103.

The television device 7100 shown in FIG. 20A can be operated with an operation switch provided in the housing 7101 or a separate remote controller 7111. Alternatively, a touch panel may be used in the display portion 7500 so that the television device 7100 can be operated by touching the touch panel. The remote controller 7111 may be provided with a display portion in addition to operation buttons.

Note that the television device 7100 may include a television receiver and a communication device for a network connection.

Figure 20B:
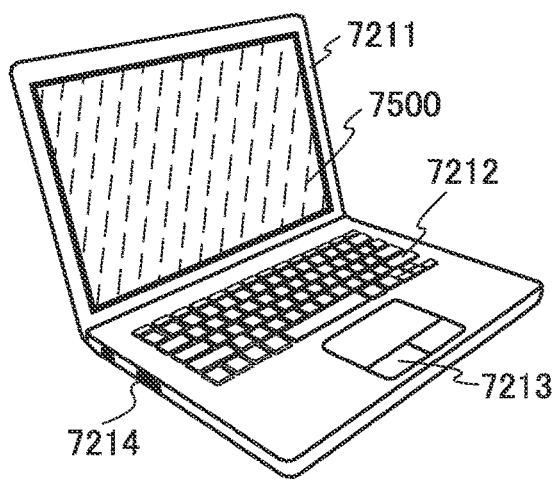

FIG. 20B shows a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 20C:
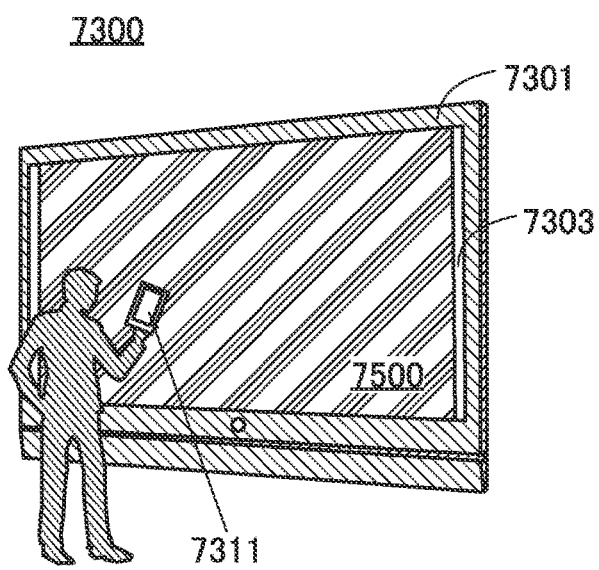
Figure 20D:
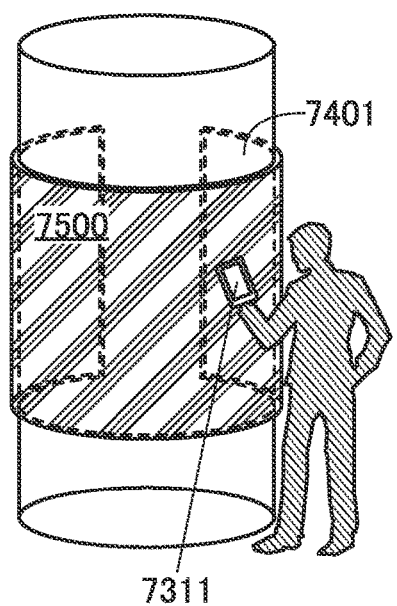

FIGS. 20C and 20D show examples of digital signage.

Digital signage 7300 shown in FIG. 20C includes a housing 7301, the display portion 7500, a speaker 7303, and the like. The digital signage 7300 can also include an LED lamp, an operation key (including a power switch or an operation switch), a connection terminal, a variety of sensors, a microphone, and the like.

FIG. 20D shows digital signage 7400 mounted on a cylindrical pillar 7401. The digital signage 7400 includes the display portion 7500 provided along a curved surface of the pillar 7401.

The larger display portion 7500 can provide a larger amount of information at a time and attract more attention, increasing the effectiveness of the advertisement, for example.

A touch panel is preferably used in the display portion 7500 so that the user can operate the digital signage 7300 or the digital signage 7400. Thus, the digital signage 7300 or the digital signage 7400 can be used for not only advertising but also providing information that the user needs, such as route information, traffic information, and an information map of a commercial facility.

Furthermore, as shown in FIGS. 20C and 20D, it is preferable that the digital signage 7300 or the digital signage 7400 work with an information terminal 7311 such as a user's smartphone through wireless communication. For example, advertisement displayed on the display portion 7500 can also be displayed on a screen of the information terminal 7311, or display on the display portion 7500 can be switched by operating the information terminal 7311.

Furthermore, it is possible to make the digital signage 7300 or the digital signage 7400 execute a game with the use of the information terminal 7311 as an operation means (controller). Thus, an unspecified number of users can join in and enjoy the game concurrently.

A display device of one embodiment of the present invention can be used in each of the display portions 7500 in FIGS. 20A to 20D.

The electronic devices of this embodiment each include a display portion; however, one embodiment of the present invention can also be used in an electronic device without a display portion.

At least a part of this embodiment can be implemented in combination with any of the other embodiments described in this specification as appropriate.

This application is based on Japanese Patent Application Serial No. 2020-201868 filed with Japan Patent Office on Dec. 4, 2020, the entire contents of which are hereby incorporated by reference.

What is claimed is:

1. A method for manufacturing a display device comprising a first transistor including a first oxide semiconductor layer, and a second transistor including a second oxide semiconductor layer, comprising the steps of:
   forming a first insulating layer over a first substrate;
   forming a first metal oxide film over the first insulating layer;
   forming a first metal film over the first metal oxide film;
   forming an island-shaped first resist mask over the first metal film;
   removing parts of the first metal film and the first metal oxide film that are not covered with the first resist mask, thereby forming an island-shaped first metal layer and an island-shaped first oxide semiconductor layer and exposing a part of a top surface of the first insulating layer;
   removing the first resist mask;
   forming a second metal oxide film over the first metal layer and the first insulating layer;
   forming a second metal film over the second metal oxide film;
   forming an island-shaped second resist mask in a region over the second metal film that does not overlap with the first metal film;
   removing parts of the second metal film and the second metal oxide film that are not covered with the second resist mask, thereby forming an island-shaped second metal layer and an island-shaped second oxide semiconductor layer;
   removing the second resist mask; and
   removing the first metal layer and the second metal layer.

2. The method for manufacturing a display device, according to claim 1,
   wherein the first metal oxide film contains indium, zinc, and gallium,
   wherein the second metal oxide film contains indium, and
   wherein a proportion of indium atoms to atoms of metal elements in the second metal oxide film is higher than that in the first metal oxide film.

3. The method for manufacturing a display device, according to claim 1,
   wherein the second metal oxide film contains indium, zinc, and gallium,
   wherein the first metal oxide film contains indium, and
   wherein a proportion of indium atoms to atoms of metal elements in the first metal oxide film is higher than that in the second metal oxide film.

4. The method for manufacturing a display device, according to claim 1,
   wherein the first metal film is etched by a dry etching method and the first metal oxide film is etched by a wet etching method,
   wherein the second metal film is etched by a dry etching method and the second metal oxide film is etched by a wet etching method, and
   wherein the first metal layer and the second metal layer are etched by a wet etching method.

5. The method for manufacturing a display device, according to claim 1,
   wherein tungsten, molybdenum, or titanium is used for the first metal film and the second metal film.

6. A method for manufacturing a display device comprising a first transistor including a first oxide semiconductor layer, and a second transistor including a second oxide semiconductor layer, comprising the steps of:
   forming a first insulating layer over a first substrate;
   forming a first metal oxide film over the first insulating layer;
   forming a first metal film over the first metal oxide film;
   forming an island-shaped first resist mask over the first metal film;
   removing a part of the first metal film that is not covered with the first resist mask, thereby forming an island-shaped first metal layer;
   removing the first resist mask;
   removing a part of the first metal oxide film that is not covered with the first metal film, thereby forming an island-shaped first oxide semiconductor layer and exposing a part of a top surface of the first insulating layer;

forming a second metal oxide film over the first metal layer and the first insulating layer;

forming a second metal film over the second metal oxide film;

forming an island-shaped second resist mask in a region over the second metal film that does not overlap with the first metal film;

removing a part of the second metal film that is not covered with the second resist mask, thereby forming an island-shaped second metal layer;

removing the second resist mask;

removing a part of the second metal oxide film that is not covered with the second metal film, thereby forming an island-shaped second oxide semiconductor layer; and removing the first metal layer and the second metal layer.

7. The method for manufacturing a display device, according to claim 6, wherein the first metal oxide film contains indium, zinc, and gallium, wherein the second metal oxide film contains indium, and wherein a proportion of indium atoms to atoms of metal elements in the second metal oxide film is higher than that in the first metal oxide film.

8. The method for manufacturing a display device, according to claim 6, wherein the second metal oxide film contains indium, zinc, and gallium, wherein the first metal oxide film contains indium, and wherein a proportion of indium atoms to atoms of metal elements in the first metal oxide film is higher than that in the second metal oxide film.

9. The method for manufacturing a display device, according to claim 6, wherein the first metal film is etched by a dry etching method and the first metal oxide film is etched by a wet etching method, wherein the second metal film is etched by a dry etching method and the second metal oxide film is etched by a wet etching method, and wherein the first metal layer and the second metal layer are etched by a wet etching method.

10. The method for manufacturing a display device, according to claim 6, wherein tungsten, molybdenum, or titanium is used for the first metal film and the second metal film.

* * * * *